United States Patent
Suda

(10) Patent No.: US 11,073,912 B2
(45) Date of Patent: Jul. 27, 2021

(54) MAGNETIC DEFORMABLE MEMBER

(71) Applicant: SEKISUI POLYMATECH CO., LTD., Saitama (JP)

(72) Inventor: Hiromi Suda, Saitama (JP)

(73) Assignee: SEKISUI POLYMATECH CO., LTD., Saitama (JP)

( * ) Notice: Subject to any disclaimer, the term of this patent is extended or adjusted under 35 U.S.C. 154(b) by 411 days.

(21) Appl. No.: 16/315,204

(22) PCT Filed: Jun. 26, 2017

(86) PCT No.: PCT/JP2017/023367
§ 371 (c)(1),
(2) Date: Jan. 4, 2019

(87) PCT Pub. No.: WO2018/008444
PCT Pub. Date: Jan. 11, 2018

(65) Prior Publication Data
US 2019/0324544 A1    Oct. 24, 2019

(30) Foreign Application Priority Data
Jul. 7, 2016   (JP) .............................. JP2016-135300

(51) Int. Cl.
*H01F 7/00* (2006.01)
*G06F 3/01* (2006.01)
*G09B 21/00* (2006.01)

(52) U.S. Cl.
CPC ............ *G06F 3/016* (2013.01); *G09B 21/004* (2013.01)

(58) Field of Classification Search
CPC ......... H01L 41/06; H01L 41/12; H01L 41/20; H01L 41/47; G06F 3/01; G06F 3/016;
(Continued)

(56) References Cited

U.S. PATENT DOCUMENTS 4,499,442 A * 2/1985 Kamo ................ H01H 51/2281
                                                          335/79
4,616,796 A * 10/1986 Inoue .................... B23Q 3/1546
                                                          248/206.5
(Continued)

FOREIGN PATENT DOCUMENTS

JP        S6243380 U      3/1987
JP        H06224485 A     8/1994
(Continued)

OTHER PUBLICATIONS

International Search Report (with English translation) and Written Opinion issued in International Patent Application No. PCT/JP2017/023367, 9 pages, dated Sep. 26, 2017.

*Primary Examiner* — Shawki S Ismail
*Assistant Examiner* — Lisa N Homza
(74) *Attorney, Agent, or Firm* — Buchanan, Ingersoll & Rooney PC

(57) ABSTRACT

A magnetic deformable member includes a magnetic portion formed of a magnetic elastic body, and a base portion formed of a non-magnetic elastic body to cover at least a side surface of the magnetic portion. At least the magnetic portion has a magnetic deformable portion in which shape deformation is caused by application of a magnetic field. The magnetic deformable portion is provided at a boundary-side end portion on the boundary with the base portion. A display portion in which the shape deformation is displayed is provided on a front surface s1 of the magnetic deformable member. With the magnetic deformable member, a tactile feel or viewability of the display portion can be varied by deforming the boundary between the magnetic portion and the base portion.

18 Claims, 9 Drawing Sheets

(58) Field of Classification Search
CPC .................. G06F 3/044; G06F 3/0202; G06F 2203/04105; G06F 2203/04809; G09B 21/004; G09F 19/02; G09F 9/37
USPC .......................................................... 335/215
See application file for complete search history.

(56) References Cited

U.S. PATENT DOCUMENTS

| | | | | |
|---|---|---|---|---|
| 5,121,091 | A * | 6/1992 | Fujiyama | H01H 13/702 335/1 |
| 5,394,131 | A * | 2/1995 | Lungu | F16D 67/06 251/129.01 |
| 5,717,423 | A | 2/1998 | Parker | |
| 6,864,679 | B2 * | 3/2005 | Yokoji | H01H 5/02 200/404 |
| 2004/0029082 | A1 | 2/2004 | Fournier et al. | |
| 2005/0068135 | A1 * | 3/2005 | Nishino | G05G 9/047 335/207 |
| 2007/0296532 | A1 * | 12/2007 | Ko | H02K 33/18 335/219 |
| 2008/0068688 | A1 * | 3/2008 | Mizoguchi | H02K 33/02 359/224.1 |
| 2008/0182228 | A1 | 7/2008 | Hafez et al. | |
| 2009/0236219 | A1 * | 9/2009 | Endo | H01J 37/3408 204/192.15 |
| 2009/0315690 | A1 * | 12/2009 | Hwang | G06F 3/041 340/407.2 |
| 2010/0141411 | A1 * | 6/2010 | Ahn | G06F 3/0447 340/407.2 |
| 2010/0197148 | A1 * | 8/2010 | Rudisill | H01R 13/2407 439/40 |
| 2010/0328231 | A1 * | 12/2010 | Pasquero | G06F 1/1662 345/173 |
| 2011/0148608 | A1 * | 6/2011 | Grant | G06F 3/016 340/407.2 |
| 2011/0242009 | A1 * | 10/2011 | Gray | G06F 1/1626 345/173 |
| 2012/0112859 | A1 * | 5/2012 | Park | H01H 25/002 335/205 |
| 2014/0035708 | A1 * | 2/2014 | Athanasiou | H01F 1/0063 335/296 |
| 2015/0331528 | A1 * | 11/2015 | Robinson | G06F 3/0482 345/173 |
| 2016/0011666 | A1 * | 1/2016 | Evreinov | G06F 3/041 345/173 |
| 2016/0188086 | A1 * | 6/2016 | Yairi | G06F 3/0412 345/174 |
| 2019/0094971 | A1 * | 3/2019 | Kim | H01F 7/1638 |
| 2019/0286241 | A1 * | 9/2019 | Gray | G09B 21/003 |
| 2020/0393907 | A1 * | 12/2020 | Gray | G06F 3/041 |
| 2021/0018982 | A1 * | 1/2021 | Salada | G06F 3/016 |

FOREIGN PATENT DOCUMENTS

| | | |
|---|---|---|
| JP | H06259007 A | 9/1994 |
| JP | 2004295087 A | 10/2004 |
| JP | 2006243812 A | 9/2006 |
| JP | 2008502017 A | 1/2008 |
| JP | 4402389 B2 | 1/2010 |
| JP | 4874498 B2 | 2/2012 |
| JP | 2012125136 A | 6/2012 |
| JP | 2014052586 A | 3/2014 |
| JP | 2015162202 A | 9/2015 |

* cited by examiner

MAGNETIC DEFORMABLE MEMBER

TECHNICAL FIELD

The present invention relates to a magnetic deformable member that includes a display portion provided on the front surface to provide humans with a tactile feel or viewability that is variable.

BACKGROUND ART

It has hitherto been known to use a magnetic elastic body as an actuator utilizing the properties of the magnetic elastic body, in which a flexible elastic body contains magnetic bodies, to be varied in shape when a magnetic field is applied. For example, Japanese Unexamined Patent Application Publication No. 2012-125136 (PTL 1) describes a magnetism-responsive actuator that is expandable and contractible in accordance with the intensity of a magnetic field.

CITATION LIST

Patent Literature

PTL 1: Japanese Unexamined Patent Application Publication No. 2012-125136

SUMMARY OF INVENTION

Technical Problem

Japanese Unexamined Patent Application Publication No. 2012-125136 (PTL 1) describes the relationship between a magnetic field and deformation of the magnetic elastic body in detail, and describes application of the magnetic elastic body to a massaging machine as a specific example of use.

The inventor studied a variety of magnetic materials and elastic materials including the magnetic elastic body described in the publication, and found interesting properties of such materials. That is, the inventor made repeated studies on the interesting nature, and succeeded in finding a new possibility of the magnetic elastic body, application of alternative materials, and development of new usage. The present invention provides such a technology.

Solution to Problem

In order to achieve the foregoing object, the present invention provides a magnetic deformable member configured as follows.

That is, the present invention provides a magnetic deformable member including a magnetic portion formed of a magnetic elastic body, and a base portion formed of a non-magnetic elastic body that covers at least a side surface of the magnetic portion, in which at least the magnetic portion has a magnetic deformable portion in which shape deformation is caused by application of a magnetic field, the magnetic deformable portion being provided at a boundary-side end portion on a boundary with the base portion, and a display portion in which the shape deformation is displayed is provided on a front surface of the magnetic deformable member.

This deformation may be caused such that the boundary-side end portion projects relatively outward with respect to a center portion of the magnetic portion.

It is indicated that, when a magnetic field is applied to a member that includes only a magnetic portion and no base portion, the entire magnetic portion is recessed in a direction in which the thickness of the magnetic portion is reduced, or the magnetic portion is expanded in the thickness direction according to a different document. Both these examples indicate that the magnetic portion is deformed in one of a direction in which the outer shape of the magnetic portion is expanded and a direction in which the outer shape of the magnetic portion is contracted. In contrast to the related art, the present invention has succeeded in displacing boundary-side end portion of the magnetic portion on the boundary with the base portion, by providing the base portion which is non-magnetic and elastic together with the magnetic portion which is magnetic and elastically deformable. This phenomenon is considered to be caused by synergy of a stress in the compressing direction due to a magnetic force, a stress in the expanding direction to let the volume for an amount corresponding to a reduction in thickness due to compression deformation go outward, a force of the base portion to suppress the stress in the expanding direction, etc. in uniform magnetic flux.

The displacement at the boundary-side end portion of the magnetic portion on the boundary with the base portion may be caused such that the boundary-side end portion projects relatively outward with respect to a center portion of the magnetic portion. This displacement is allowed by not only the magnetic portion itself being flexible and elastically deformable by a magnetic field, but also the base portion which contacts the magnetic portion being also elastic, so that the base portion suppresses deformation of the magnetic portion and, at the same time, the boundary portion of the base portion with the magnetic portion is expandable along with deformation of the magnetic portion.

The base portion may have a base deformable portion in which shape deformation is caused along with the shape deformation of the magnetic deformable portion of the magnetic portion, the base deformable portion being provided at a boundary-side end portion on a boundary with the magnetic portion.

Since the base portion has a base deformable portion in which shape deformation is caused along with the shape deformation of the magnetic deformable portion of the magnetic portion, not only the magnetic portion but also the base portion can be deformed, thereby deforming the boundary portion between the magnetic portion and the base portion.

The magnetic deformable member may include a rigid hard portion provided on respective surfaces of the base portion and the magnetic portion that are opposite to the front surface.

Since a rigid hard portion is provided on the respective back surfaces of the base portion and the magnetic portion which are opposite to the front surface on which the display portion is provided, displacement of the magnetic portion in the direction of the back surface which is opposite to the front surface can be suppressed, thereby increasing displacement toward the outer side from the front surface.

The magnetic deformable member may include a protecting portion provided on the front surface to protect respective surfaces of the magnetic portion and the base portion.

Since a protecting portion is provided on the front surface of the magnetic deformable member, the durability of the magnetic deformable member can be enhanced by protecting the base portion and the magnetic portion which are formed of materials that are susceptible to friction or tear such as a gel. In addition, the tactile feel and the operability of the front surface can be improved.

The magnetic deformable member may include a regulating portion provided at an outer edge of the base portion, the regulating portion being harder than the base portion. Since a regulating portion that is harder than the base portion is provided at the outer edge of the base portion, displacement at the boundary portion between the magnetic portion and the base portion can be increased by suppressing expanding deformation of the magnetic portion and the base portion toward the outer side.

The magnetic deformable member may include a magnet provided opposite to the front surface to apply the magnetic field. Since a magnet is provided on the back surface which is opposite to the front surface, the magnet can be disposed on only one side of the magnetic deformable member. Hence, the magnet can be hidden behind the back side of the magnetic deformable member.

A magnet may be disposed to form the magnetic field by applying a magnetic force line in a direction intersecting the front surface. Since a magnet is disposed to form the magnetic field by applying a magnetic force line in a direction intersecting the front surface, the boundary between the base portion and the magnetic portion can be displaced significantly in a direction that is perpendicular to the front surface.

In the magnetic deformable member, the display portion may be an operation portion on which a touch operation or a pressing operation for an electronic device is performed.

Since the display portion is an operation portion on which a touch operation or a pressing operation for an electronic device is performed, the display portion can be utilized as an operation portion that includes a touch panel or a push button switch.

In the magnetic deformable member, the magnetic deformable portion may be shaped to display a Braille character, a character, a numeral, a symbol, or a pattern.

That is, since a Braille character, a character, or a numeral can be displayed through displacement of the boundary-side end portion of the magnetic portion on the boundary with the base portion, the magnetic deformable member can be utilized as a display device that displays a Braille character, a character, or a numeral.

In the magnetic deformable member, a plurality of magnetic portions may be provided, and the plurality of magnetic portions may be disposed such that respective magnetic deformable portions of the magnetic portions are integrated with each other to form predetermined display.

Since a plurality of magnetic portions are provided and the plurality of magnetic portions are disposed such that respective magnetic deformable portions of the magnetic portions are integrated with each other to form predetermined display, desired display such as a Braille character or a character can be formed by causing the individual magnetic portions to function as dots that constitute a part of a Braille character, a character, a numeral, or a variety of images.

In the magnetic deformable member, the magnetic portion may be shaped to penetrate the base portion in a thickness direction. With the magnetic portion formed to penetrate the base portion, the magnetic portion can be displaced to project significantly on the boundary with the base portion by increasing the volume of the magnetic portion which is subjected to compression deformation to be expanded outward when a magnetic field is applied.

In the magnetic deformable member, the base portion may cover a portion of the magnetic portion other than the front surface. With the base portion covering a portion of the magnetic portion other than the front surface, that is, with the base portion covering the side surfaces and the bottom surface, rather than the front surface, of the magnetic portion so that the magnetic portion is distributed unevenly on the side of the front surface, a magnetic deformable member that is entirely flexible irrespective of application of a magnetic field can be obtained, since the base portion which is stacked on the lower side of the magnetic portion is soft and elastically deformable even when the magnetic portion is hardened by application of a magnetic field.

The magnetic portion may be formed to project from the base portion. Since the magnetic portion is formed to project from the base portion, the magnetic portion which projects can be easily visually recognized, and can be easily contacted by a human finger or the like. Therefore, variations in viewability or tactile feel of the magnetic portion can be felt easily.

The magnetic portion may be formed as a gel. With the magnetic portion formed as a gel, the magnetic portion can be easily deformed by application of a magnetic field. Compared to a case where the magnetic portion is formed using a fluid, in addition, there is no fear of fluid leakage, and the durability of the magnetic deformable member can be enhanced.

The magnetic portion may have a viscous fluid in which magnetic bodies are dispersed and a flexible film that covers the viscous fluid. Since the magnetic portion has a viscous fluid in which magnetic bodies are dispersed and a flexible film that covers the viscous fluid, variations in hardness of the magnetic portion due to application of a magnetic field can be increased.

The magnetic portion may be formed of a thin film made of a magnetic metal foil or a flexible magnetic film. Since the magnetic portion is formed of a thin film made of a magnetic metal foil or a flexible magnetic film, the magnetic deformable member can be formed easily by insert molding of the magnetic metal foil or the flexible magnetic film performed using a mold for forming a base portion.

The magnetic portion may have an E hardness, prescribed by JIS, of 0 to 50. Since the magnetic portion has an E hardness, prescribed by JIS, of 0 to 50, magnetic bodies contained in the magnetic portion can be moved over a long distance by the action of a magnetic field, thereby increasing displacement upon application of a magnetic field. In addition, the magnetic portion is flexible before application of a magnetic field, while the magnetic portion is hardened after application of a magnetic field, variations in tactile feel due to variations in hardness can be obtained easily.

Advantageous Effects of Invention

According to the present invention, a magnetic deformable member that can be recognized with a tactile feel or viewability can be obtained.

BRIEF DESCRIPTION OF DRAWINGS

FIG. 1 illustrates an essential portion of a magnetic deformable member according to a first embodiment, in which

FIG. 3 illustrates a case where the magnetic deformable member according to the first embodiment is provided with a regulating portion, in which

FIG. 7 illustrates an essential portion of a magnetic deformable member according to a second embodiment, in which

FIG. 10 illustrates an essential portion of a magnetic deformable member according to a third embodiment, in which

FIG. 12 illustrates a state in which a magnetic field is applied by a magnet to the magnetic deformable member according to the third embodiment, in which

FIG. 13 illustrates an essential portion of a magnetic deformable member according to a fourth embodiment, in which

FIG. 14 illustrates an essential portion of a magnetic deformable member according to a fifth embodiment, in which

FIG. 15 illustrates an essential portion of a magnetic deformable member according to a sixth embodiment, in which

DESCRIPTION OF EMBODIMENTS

A magnetic deformable member according to the present invention will be described with reference to the drawings. Redundant description of the same material, composition, manufacturing process, function, effect, etc. among embodiments will be omitted.

Main constituent units that constitute the magnetic deformable member will be first described with reference to first to third embodiments, and application examples formed with such constituent units will be described with reference to fourth to sixth embodiments.

First Embodiment [FIGS. 1 to 6]

Figure 1A:
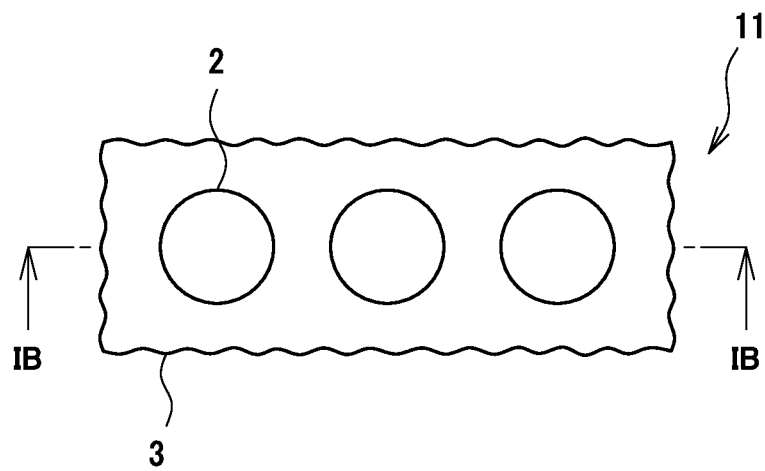
FIG. 1(A) is a plan view of the essential portion and FIG. 1(B) is a sectional view taken along the line 1(B)-1(B) of FIG. 1(A).
Figure 1B:
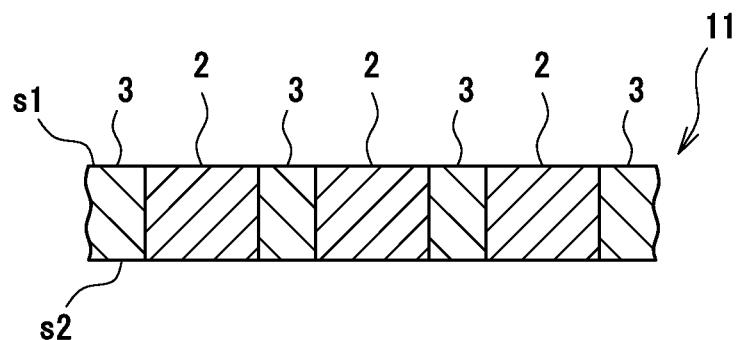

FIG. 1 illustrates the configuration of an essential portion of a magnetic deformable member 11 according to the present embodiment. FIG. 1(A) is a plan view of the magnetic deformable member 11, and FIG. 1(B) is a sectional view of the magnetic deformable member 11. As illustrated in FIG. 1, the magnetic deformable member 11 includes magnetic portions 2 and a base portion 3. In the present embodiment, the magnetic portions 2 penetrate the base portion 3 in the thickness direction, and side surfaces of the magnetic portions 2 are covered by the base portion 3. The magnetic deformable member 11 has a sheet-like outer shape, in which the magnetic portions 2 illustrated in FIG. 1 are covered by the base portion 3. As discussed later, a front surface s1 of the sheet serves as a display portion that is deformable by application of a magnetic field. The magnetic portions 2 and the base portion 3 which constitute the magnetic deformable member 11 will be described next.

<Magnetic Portion>

The magnetic portions 2 are made of a rubber material (elastic body) that is elastically deformable, and have properties. In one form, the magnetic portions 2 are gel-like members containing, as main components, a binder and magnetic bodies dispersed in the binder. In this case, the magnetic bodies exhibit magnetic properties.

In order to generate a large stress when a magnetic field is applied, the magnetic bodies are preferably a ferromagnetic material. Meanwhile, the magnetic bodies are preferably a soft magnetic material, since the magnetic bodies preferably do not interact with each other when a magnetic field is not applied. Examples of the soft magnetic material include metal soft magnetic materials such as iron, nickel, and cobalt, soft magnetic alloys such as iron-silicon alloy, permalloy, sendust, and permendur, and magnetic powder such as soft ferrite.

The amount of the magnetic bodies contained in the magnetic portions 2 is preferably 6 to 60 vol %, and 64 to 92 mass % in terms of mass proportion. When the content of the magnetic bodies is less than 6 vol %, the amount of deformation of the magnetic portions 2 may be small, and the hardness of the magnetic portions 2 may be low. When the content of the magnetic bodies is more than 60 vol %, meanwhile, the hardness of the magnetic portions 2 may be so high when a magnetic field is not applied, the magnetic portions 2 may not be easily deformable when a magnetic field is applied.

In order to increase the deformation of the magnetic portions 2 to be discussed later, the distance between the magnetic bodies in the magnetic portions 2 is preferably variable, and the magnetic portions 2 preferably contain the magnetic bodies in relatively small amounts so that the magnetic bodies are dispersed apart from each other. Specifically, the amount of the magnetic bodies contained in the magnetic portions 2 is preferably 20 to 40 vol %, and 64 to 83 mass % in terms of mass proportion, in order to obtain magnetic portions 2 with great variations in tactile feel when a magnetic field is applied.

To increase the hardness of the magnetic portions 2 when a magnetic field is applied, in addition, there are preferably more contact points among the magnetic bodies in order to fix the relative positions of the magnetic bodies. More specifically, it is conceivable that the magnetic portions 2 preferably contain slightly more magnetic bodies so that the distance between the dispersed magnetic bodies is shorter and there are more contact points between a certain magnetic body and magnetic bodies around the magnetic body within the reach of the magnetic force of the magnetic body. Thus, in order to increase the hardness of the magnetic portions 2 when a magnetic field is applied, the amount of the magnetic bodies contained in the magnetic portions 2 is preferably 20 to 49 vol %, and 64 to 88 mass % in terms of mass proportion.

When the content of the magnetic bodies is increased, the hardness of the magnetic portions 2 also tends to be enhanced when a magnetic field is not applied. Since the hardness is increased to a greater degree when a magnetic field is applied, however, the amount of the magnetic bodies to be added is preferably increased also in the case where it is desirable to increase variations in hardness when a magnetic field is applied.

The average particle diameter of the magnetic bodies is preferably 0.05 to 1000 μm. In the case where the average particle diameter is less than 0.05 μm, a small magnetic force acts on individual magnetic bodies, and therefore a stress for displacement may be small to result in small displacement. When the average particle diameter is more than 1000 μm, on the other hand, a large magnetic force acts on each particle of the magnetic powder, and the magnetic powder may fall down when a magnetic field is applied.

The magnetic bodies may be in a variety of shapes such as a spherical shape, a block shape, a columnar shape, a needle shape, a plate shape, and a scale shape. From the viewpoint of increasing displacement when a magnetic field is applied, however, particles with a low aspect ratio such as particles in a spherical shape are preferable. This is because use of such particles causes large displacement with particles, which have been apart from each other, reliably approaching each other when a magnetic field is applied. In the case where particles with a high aspect ratio are used, in contrast, individual particles may approach other particles when the particles are rotated, which may result in a relatively small amount of displacement. Also from the viewpoint of increasing variations in hardness when a magnetic field is applied, in addition, particles with a low aspect ratio such as particles in a spherical shape are preferable. This is because the magnetic bodies closely approach each other to increase hardness.

The binder is made of a high-polymer material. Examples of the binder include a high-polymer gel, rubber, and a thermoplastic elastomer which are highly flexible. Examples of the high-polymer gel include a silicone gel and a polyurethane gel. Examples of the rubber include natural rubber, butadiene rubber, isoprene rubber, styrene-butadiene copolymer rubber, nitrile rubber, hydrogenated nitrile rubber, chloroprene rubber, ethylene-propylene copolymer rubber, chlorinated polyethylene rubber, chlorosulfonated polyethylene rubber, butyl rubber, halogenated butyl rubber, fluorocarbon rubber, urethane rubber, silicone rubber, polyisobutylene rubber, and acrylic rubber. Examples of the thermoplastic elastomer include a styrene thermoplastic elastomer, an olefin thermoplastic elastomer, a polyester thermoplastic elastomer, and a polyurethane thermoplastic elastomer. Among these, use of a silicone gel which can be highly filled with magnetic bodies and which can be hardened to form a significantly flexible gel is preferable. Such high-polymer materials may be used in combination of two or more kinds thereof, rather than being used singly.

The binder preferably has a hardness value of 50 or less, the hardness value (hereinafter "E hardness") being measured by a hardness meter of the type E of Japan Industrial Standard (JIS) K 6253. When the hardness is more than E50, variations in shape or variations in hardness when a magnetic field is applied may be reduced. The lower limit of the E hardness is not defined since values that are the measurement limit or less (E0 or less) are also included in the preferable range. When the values that are E0 or less are evaluated using a penetration number which is another scale, penetration numbers of up to 320 are preferably used, and penetration numbers of up to 340 can be used. When the binder is softer with a penetration number of more than 340, the magnetic deformable member 11 may be deformed by its own weight and may not maintain its shape.

The above penetration number is obtained as a result of measuring the penetration number for a front surface of a test piece using a device described in JIS K 2220. That is, a needle in the shape prescribed in JIS K 2207 is used, and the total weight of the needle and a needle fixing device (i.e. the weight on the test piece) is 50 g.

In the magnetic portion 2, the magnetic bodies are dispersed in the binder. Besides the magnetic bodies and the binder, the magnetic portions 2 may contain a variety of additives that do not impair the function thereof. For example, the magnetic portions 2 may contain an organic component such as a plasticizer, a disperser, a coupling agent, and a tackiness agent. In addition, other components such as a fire retardant, an antioxidant, and a coloring agent may also be added as appropriate.

<Base Portion>

The base portion 3 is made of a non-magnetic material, and formed so as to surround the magnetic portions 2. As with the magnetic portions 2, the base portion 3 is also made of a rubber material (elastic body) that is elastically deformable. In one form, the base portion 3 can be in a gel state, and can have a flexible tactile feel. The base portion 3 is preferably not magnetized at all in a magnetic field. However, a base portion 3 containing such a small amount of a magnetic filler that does not significantly increase the magnetism of the base portion 3 is not excluded, and it is only necessary that the base portion 3 should be substantially non-magnetic by being much less magnetized than the magnetic portions 2.

As with the binder of the magnetic portions 2, the base portion 3 can also be formed of a high-polymer material. Specific examples of the binder include a high-polymer gel, rubber, and a thermoplastic elastomer which are highly flexible. The high-polymer material which is used for the base portion 3 may be the same as or different from the binder of the magnetic portions 2. If the same high-polymer material is used, there are advantages such as enhanced adhesion between the base portion 3 and the magnetic portions 2 for easy integration.

The hardness of the base portion 3 may be the same as or different from the hardness of the magnetic portions 2. If the hardness of the base portion 3 and the hardness of the magnetic portions 2 are the same as each other, an integral magnetic deformable member 11 in which the difference in hardness between the magnetic portions 2 and the base portion 3 is not felt and the boundary therebetween is not distinct when a magnetic field is not applied can be obtained. When a magnetic field is applied, on the other hand, the magnetic portions 2 become harder, and thus the difference in hardness between the magnetic portions 2 and the base portion 3 can be felt. If the hardness of the base portion 3 is higher than the hardness of the magnetic portions 2, meanwhile, a regulating force in a direction in which the magnetic portions 2 are to be expanded when a magnetic field is applied is intensified to increase outward displacement of end portions 2b of the magnetic portions 2. However, displacement at the boundary portion between the magnetic portions 2 and the base portion 3 is also regulated by the base portion 3, and therefore the upper limit of the hardness is preferably a penetration number of 80.

<Hard Portion>

Figure 2:
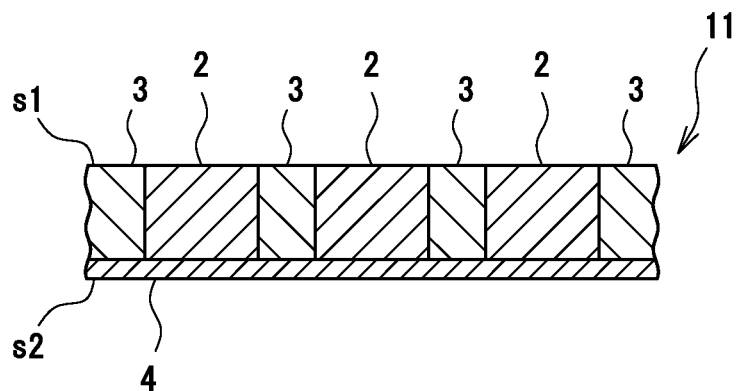
FIG. 2 illustrates a case where the magnetic deformable member according to the first embodiment is provided with a hard portion, and is a sectional view corresponding to FIG. 1(B).

As illustrated in FIG. 2, a rigid hard portion 4 can be stacked on respective surfaces s2 of the magnetic portions 2 and the base portion 3 that are opposite to the front surface s1. The hard portion 4 can suppress deformation of the magnetic portions 2 toward the opposite side from the front surface s1 in the case where a magnetic field is applied. Consequently, it is conceivable that end portions 2b of the magnetic portions 2 can be deformed outward more significantly than in the case where the hard portion 4 is not provided.

The hard portion 4 is integrated by the adhesion of the base portion 3 and the magnetic portions 2. However, the hard portion 4 may be integrated using an adhesive or the like, or may be configured not to be integrated. The hard portion 4 may be formed of a hard resin.

<Regulating Portion>

Figure 3A:
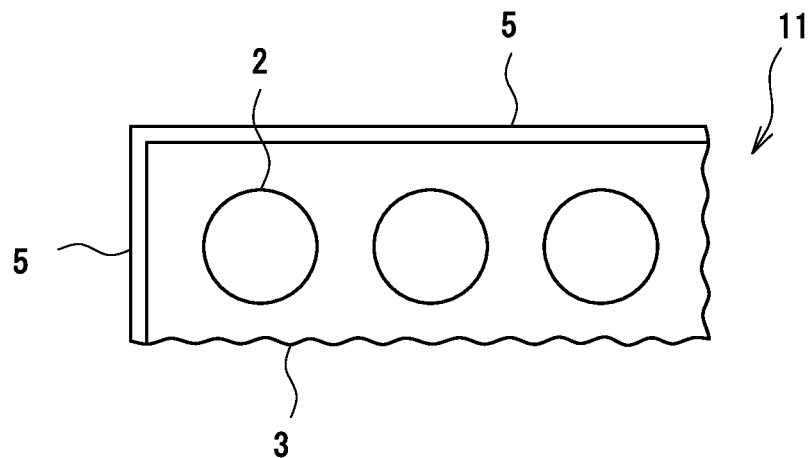
FIG. 3(A) is a plan view of the upper left end of the magnetic deformable member and FIG. 3(B) is a plan view of the lower right end of the magnetic deformable member.
Figure 3B:
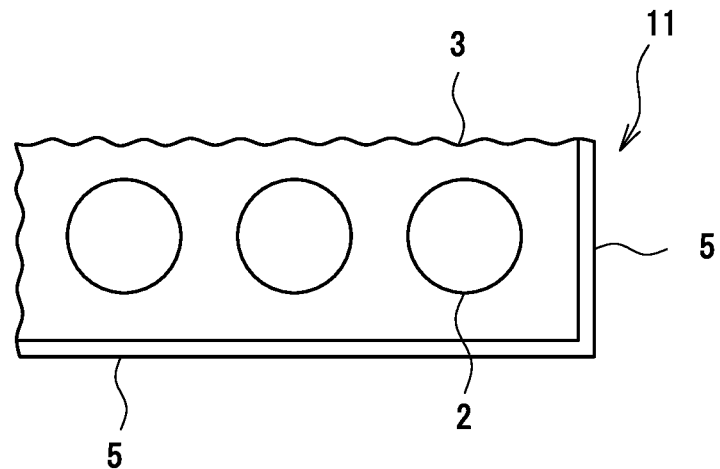

As illustrated in FIG. 3, regulating portions 5 may be provided at the periphery (side surfaces) of the base portion 3 to regulate expansion of the base portion 3. When a magnetic field is applied to the magnetic deformable member 11, a stress in the direction of compressing the magnetic portions 2 and expanding the magnetic portions 2 toward the periphery is caused. Since the base portion 3 is also in a gel state and is soft, however, the base portion 3 may be expanded toward the periphery. Therefore, the regulating portion 5 is provided in order to prevent such expansion.

A certain effect can be obtained if the material of the regulating portion 5 is harder than the material of the base portion 3. However, the regulating portion 5 is preferably formed of a harder resin material.

<Protecting Portion>

Figure 4:
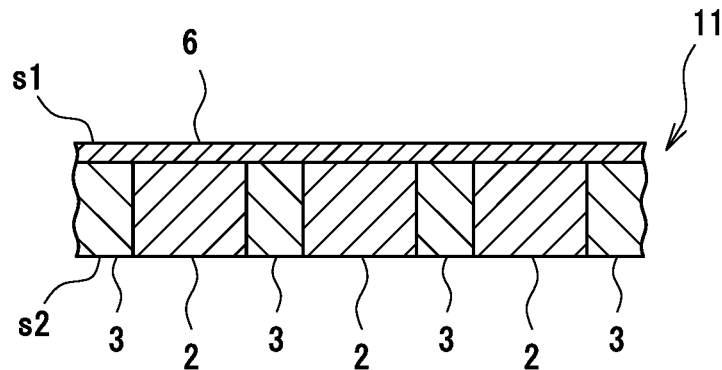
FIG. 4 illustrates a case where the magnetic deformable member according to the first embodiment is provided with a protecting portion, and is a sectional view corresponding to FIG. 1(B).

As illustrated in FIG. 4, a protecting portion 6 can be provided on the front surface s1 of the magnetic portions 2 and the base portion 3 to protect the magnetic portions 2 and the base portion 3. Since the magnetic portions 2 and the base portion 3 are made of a gel-like substance, the durability of the magnetic deformable member 11 can be enhanced by providing the protecting portion 6, and the tactile feel of the front surface s1 can be improved when the front surface s1 is used as a display portion. In addition, the functionality and the design of the magnetic deformable member 11 can be enhanced by printing characters, figures, patterns, etc. on the protecting portion 6.

While the protecting portion 6 can act to help the magnetic portions 2 to be displaced when a magnetic field is applied to the magnetic portions 2, and thereafter help the magnetic portions 2 to recover the original shape when application of a magnetic field is canceled, the protecting portion 6 may hinder displacement of the magnetic portions 2. Therefore, the protecting portion 6 is preferably so elastic as not to excessively hinder deformation of the magnetic portions 2, and as to act to undo the deformation when a magnetic field is removed. The protecting portion 6 is also preferably formed of a member that has a restoring force, and is made of a material that is expandable and contractible in accordance with deformation of the magnetic portions 2.

Such a protecting portion 6 may be a resin film or a paint film formed of synthetic rubber such as butyl rubber, styrene butadiene rubber, chloroprene rubber, nitrile rubber, urethane rubber, silicone rubber, fluorocarbon rubber, and acrylic rubber, natural rubber, a thermoplastic elastomer such as a styrene thermoplastic elastomer, an olefin thermoplastic elastomer, a urethane thermoplastic elastomer, and a vinyl chloride thermoplastic elastomer, or the like. In addition, a resin film such as an olefin resin, a polyurethane resin, a vinyl resin, and a polyethylene terephthalate resin can also be preferably used in the form of a flexible thin film.

<Operation>

Next, operation of the magnetic deformable member 11 according to the first embodiment which is provided with the hard portion 4 will be described with reference to FIGS. 5 and 6.

Figure 5:
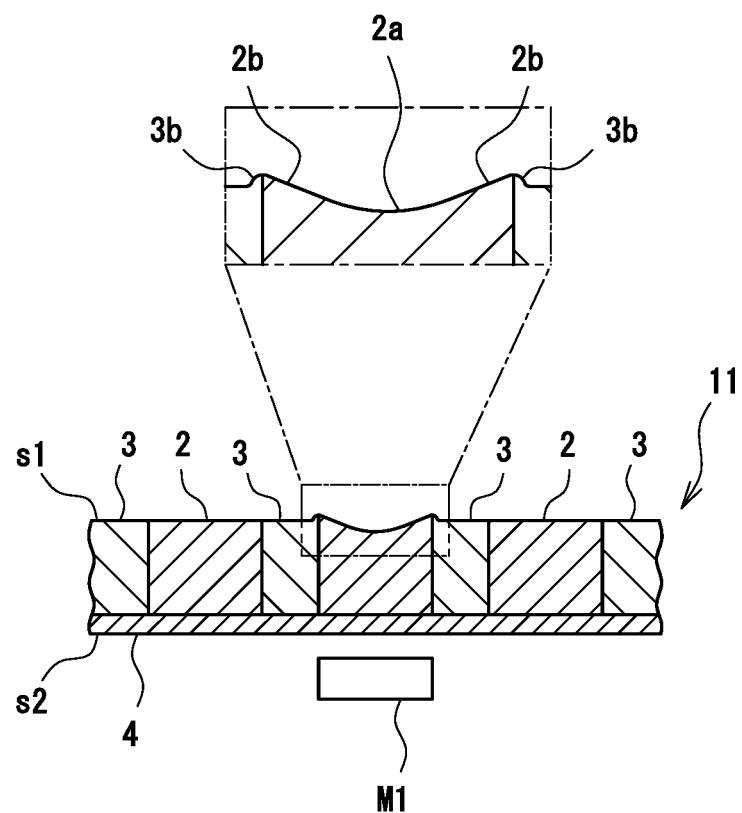
FIG. 5 illustrates a state in which a magnetic field is applied by a magnet to the magnetic deformable member according to the first embodiment, and is a sectional view corresponding to FIG. 1(B).
Figure 6:
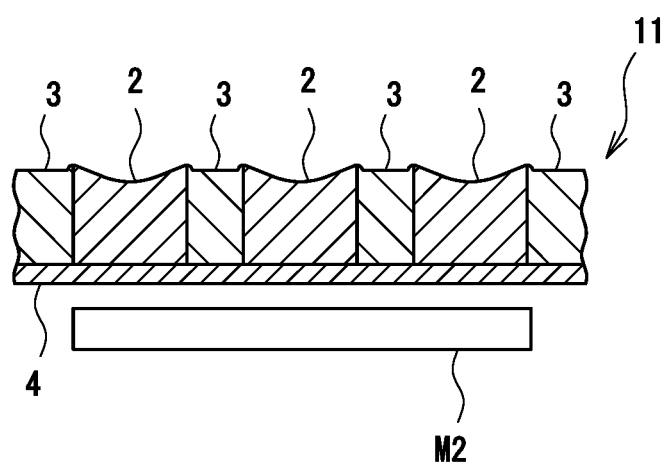
FIG. 6 illustrates a state in which a magnetic field is applied by a magnet in a different form to the magnetic deformable member according to the first embodiment, and is a sectional view corresponding to FIG. 1(B).

First, as illustrated in FIG. 5, a magnet M1 is disposed on the side of the back surface s2 on which the hard portion 4 is provided on the magnetic portions 2 and the base portion 3. The direction of the magnet M1 is determined such that the north pole and the south pole are on the upper side and the lower side, respectively, of the drawing. However, the direction of the magnet M1 may be reversed. By determining the direction of the magnet M1 in this manner, the direction of the magnetic force line can coincide with a direction intersecting the front surface s1. When a magnetic field is applied with the magnet M1 disposed in this manner, a center portion 2a of the magnetic portion 2 is displaced in the recessing direction by being attracted toward the magnet M1. On the other hand, an end portion 2b at the outer periphery of the magnetic portion 2 and on the boundary with the base portion 3 is subjected to shape deformation so as to project relatively outward with respect to the center portion 2a (magnetic deformable portion). Since the base portion 3 which contacts the magnetic portion 2 is also an elastic body, a boundary-side end portion 3b of the base portion 3 on the boundary with the magnetic portion 2 is subjected to shape deformation along with the shape deformation of the end portion 2b (base deformable portion). In addition to such deformation, the entire magnetic portion 2 is hardened. This projecting deformation and hardening is immediately canceled when application of a magnetic field is canceled, that is, when the magnet M1 is removed, and the original shape and the original hardness are restored.

The reason for the deformation on the boundary between the magnetic portion 2 and the base portion 3 is not clear, but is considered to be as follows. When a magnetic deformable member 11 is placed in magnetic flux, a stress in the compressing direction due to a magnetic force is caused to displace the center portion 2a in the recessing direction, but a force for displacement in the expanding direction to let the volume go outward also acts. However, the base portion 3 surrounds the periphery of the magnetic portion 2, and the stress in the expanding direction is regulated so as to go in the direction of the front surface. This force excels the stress in the compressing direction due to the magnet M1, and displaces an end surface 2b of the magnetic portion 2 on the side of the base portion 3 so as to project. Meanwhile, the hardening phenomenon is considered to be caused because magnetic bodies are coupled to each other and bound to harden the magnetic portion 2 when a magnetic field is applied.

The number of magnetic portions 2 to be deformed can be varied by varying the range in which a magnetic field is applied. In FIG. 5, the magnet M1 is disposed for one magnetic portion 2 such that a magnetic field is applied to the magnetic portion 2 only. When a magnet M2 is disposed such that a magnetic field is applied to three magnetic portions 2 as illustrated in FIG. 6, however, the three magnetic portions 2 can be deformed at the same time. The magnet M1, M2 can be a permanent magnet, or an electromagnet in which a coil is used.

<Manufacturing Method>

An example of a method of manufacturing the magnetic deformable member 11 will be described. First, a liquid composition in which a liquid polymer before being hardened to be a binder is compounded with magnetic bodies is prepared, and the liquid composition is injected into a mold corresponding to the shape of a magnetic portion 2 and hardened to obtain the magnetic portion 2. Next, the magnetic portion 2 is inserted into a mold for molding a base, and a liquid polymer before being hardened as the material of the base portion 3 is injected into the mold and hardened. In this manner, a magnetic deformable member 11 in which the base portion 3 and the magnetic portion 2 are integrated with each other is obtained.

Examples of a method of providing the hard portion 4 or the protecting portion 6 include: an integral molding method in which a film-shaped hard portion 4 or protecting portion 6 prepared in advance is inserted into a mold for molding a base portion 3 together with the magnetic portion 2; pasting a film-shaped hard portion 4 or protecting portion 6 after the magnetic portion 2 and the base portion 3 are formed; and providing a hard portion 4 or a protecting portion 6 on the front surface s1 or the back surface s2 of the magnetic portion 2 and the base portion 3 by painting or the like. Examples of a method of providing the regulating portion 5 include pasting the regulating portion 5 to the outer periphery of the thus obtained magnetic deformable member 11.

In the magnetic deformable member 11, when a magnetic field is applied, the magnetic portion 2 is hardened, and the boundary-side end portion 2b of the magnetic portion 2 on the boundary with the base portion 3 is displaced outward. Thus, variations in tactile feel and viewability of the front surface of the magnetic deformable member 11 between before and after a magnetic field is applied can be felt.

Modification 1

In the magnetic deformable member 11 according to the present embodiment, the material of the magnetic portion 2 has been changed from a gel-like substance to a viscous fluid in which magnetic bodies are dispersed and a flexible film that covers the viscous fluid.

Examples of the viscous fluid include liquids such as silicone oil, paraffin oil, ester oil, and liquid rubber. Among these, silicone oil is preferable because of the required performance such as temperature dependence, heat resistance, and reliability. Specific preferable examples include dimethyl silicone oil, methyl phenyl silicone oil, methyl hydrogen silicone oil, and fluorine-modified silicone oil.

The viscous fluid is compounded with the magnetic bodies described in relation to the above embodiment. The content of the magnetic bodies is preferably 6 to 47 vol %, and 64 to 87 mass % in terms of mass proportion. When the content of the magnetic bodies is less than 6 vol %, the amount of deformation of the magnetic portions 2 may be small, and the hardness of the magnetic portions 2 may be low. When the content of the magnetic bodies is more than 47 vol %, the flowability of the viscous fluid containing the magnetic bodies may be poor. Besides the magnetic bodies, a variety of solid particles that are not reactive with or insoluble in the liquid can be added to the viscous fluid. Examples of the solid particles that are not reactive with or insoluble in silicone oil include silicone resin powder, polymethylsilsesquioxane powder, wet silica, dry silica, glass beads, glass balloons, and surface-treated products thereof. Such solid particles can be used singly or in combination of a plurality thereof.

The flexible film may be a rubber-like elastic body. Preferable examples include synthetic rubber such as butyl rubber, styrene butadiene rubber, chloroprene rubber, nitrile rubber, urethane rubber, silicone rubber, fluorocarbon rubber, and acrylic rubber, natural rubber, and a thermoplastic elastomer such as a styrene thermoplastic elastomer, an olefin thermoplastic elastomer, a urethane thermoplastic elastomer, and a vinyl chloride thermoplastic elastomer.

In the configuration of the present embodiment, besides a configuration in which the entire magnetic portion 2 is covered by the flexible film, the front surface and the back surface of through holes that penetrate the base portion 3 and the side surfaces around the front surface and the back surface can be formed by the flexible film. In the configuration in which the front surface (and the back surface) and the side surfaces around the front surface (and the back surface) are formed by the flexible film, a part of the side surfaces of the through holes may be formed of a hard resin. When the hard resin is used, the magnetic fluid can be sealed easily, and the hard resin can be used for fixation to the hard portion 4 to be discussed later.

The hardness of the magnetic portion 2 in which the viscous fluid and the magnetic bodies which are dispersed in the viscous fluid are sealed with the flexible film is preferably in the same range as the hardness of the magnetic portion 2 according to the above embodiment.

Figure 7A:
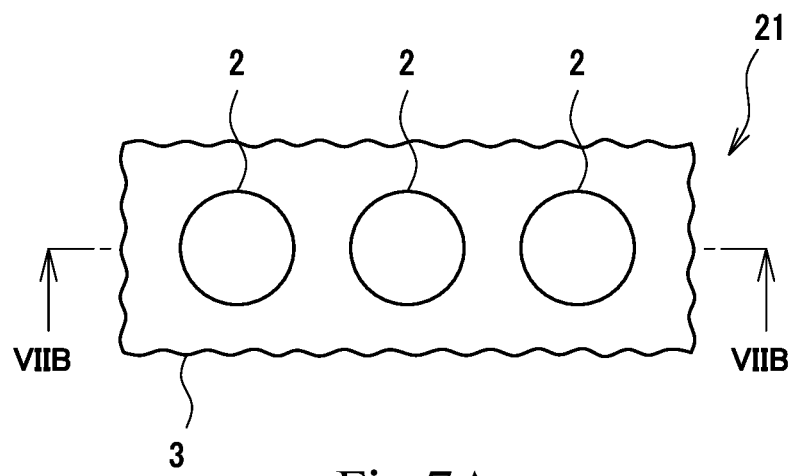
FIG. 7(A) is a plan view of the essential portion and FIG. 7(B) is a sectional view taken along the line 7(B)-7(B) of FIG. 7(A).
Figure 7B:
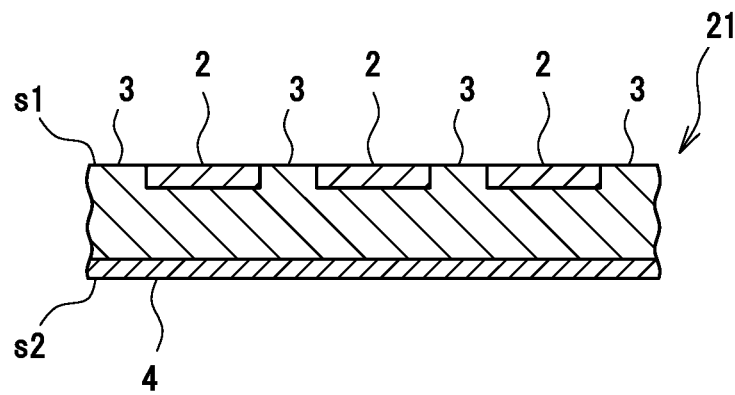
Figure 8:
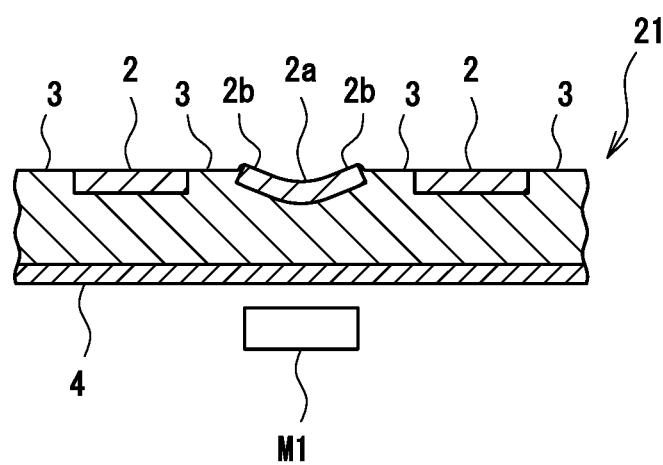
FIG. 8 illustrates a state in which a magnetic field is applied by a magnet to the magnetic deformable member according to the second embodiment, and is a sectional view corresponding to FIG. 5.
Figure 9:
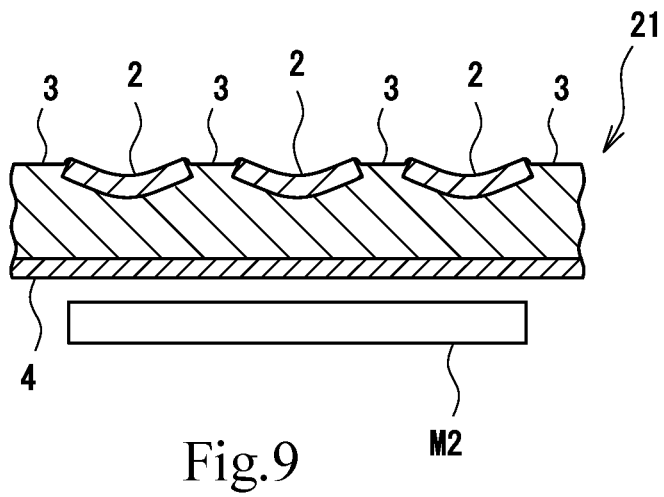
FIG. 9 illustrates a state in which a magnetic field is applied by a magnet in a different form to the magnetic deformable member according to the second embodiment, and is a sectional view corresponding to FIG. 6.

Second Embodiment [FIGS. 7 to 9]

FIG. 7 illustrates a magnetic deformable member 21 according to the present embodiment. In the magnetic deformable member 21, the magnetic portions 2 are distributed unevenly on the side of the front surface s1, and portions of the magnetic portions 2 other than the front surface s1 are covered by the base portion 3. More specifically, as illustrated in the sectional view in FIG. 7(B), the magnetic portions 2 with a predetermined thickness are formed to extend from the front surface s1 of the magnetic deformable member 21, and the base portion 3 is provided at a deeper portion exceeding the thickness of the magnetic portions 2 as with a portion around the magnetic portions 2.

FIG. 7 illustrates a configuration provided with the hard portion 4. However, it may be determined as desired whether or not to provide the hard portion 4, the regulating portion 5, and the protecting portion 6 as in the magnetic deformable member 11.

Operation of the magnetic deformable member 21 according to the present embodiment will be described with reference to FIGS. 8 and 9. First, as illustrated in FIG. 8, a magnet M1 is disposed on the side of the back surface s2 on which the hard portion 4 is provided on the magnetic portions 2 and the base portion 3. When a magnetic field is applied in this manner, a center portion 2a of the magnetic portion 2 is displaced in the recessing direction by being attracted toward the magnet M1, and an end portion 2b of the magnetic portion 2 on the boundary with the base portion 3 is displaced to project outward. In addition, the entire magnetic portion 2 is hardened. This projecting displacement and hardening is immediately canceled when application of a magnetic field is canceled, that is, when the magnet M1 is removed, and the original shape and the original hardness are restored.

If the magnet M2 is disposed so as to apply a magnetic field to three magnetic portions 2 as illustrated in FIG. 9, the three magnetic portions 2 can be deformed at the same time.

The magnetic portions 2 according to the present embodiment can be formed by a printing method. Thus, the magnetic portions 2 can be formed as a complicated pattern or a decorative pattern, and the functionality and the design of the magnetic deformable member 21 can be enhanced easily.

When the magnetic portions 2 are distributed unevenly on the side of the front surface s1, a flexible magnetic deformable member 21 can be obtained irrespective of whether or not a magnetic field is applied, since the hardness of the base portion 3 which is stacked on the lower side of the magnetic portions 2 is not varied even if the hardness of the magnetic portions 2 is varied. That is, the hardness of the magnetic portions 2 can be increased easily compared to the magnetic deformable member 11 according to the first embodiment.

Modification 1

In the magnetic deformable member 21 according to the present embodiment, the material of the magnetic portion 2 has been changed to a material that is the same as that according to Modification 1 of the first embodiment. That is, the magnetic portion 2 according to the present embodiment is formed of a viscous fluid in which magnetic bodies are dispersed and a flexible film that covers the viscous fluid.

In the configuration of the present embodiment, besides a configuration in which the entire magnetic portion 2 is covered by the flexible film, the front surface of a recessed portion provided in the front surface of the base portion 3 and a portion of the side surfaces of the recessed portion around the front surface can be formed by the flexible film. In the configuration in which the front surface and a portion of the side surfaces around the front surface are formed by the flexible film, the bottom surface and a part of the side surfaces of the recessed portion may be formed of a hard resin. When the hard resin is used, the magnetic fluid can be sealed easily.

The hardness of the magnetic portion 2 in which the viscous fluid and the magnetic bodies which are dispersed in the viscous fluid are sealed with the flexible film is preferably in the same range as the hardness of the magnetic portion 2 according to the above embodiment.

Modification 2

In the magnetic deformable member 21 according to the present embodiment, the material of the magnetic portion 2 has been changed to a magnetic metal foil. Examples of the magnetic metal foil include a soft magnetic metal foil such as iron, nickel, and cobalt, and a soft magnetic alloy foil such as iron-silicon alloy, permalloy, sendust, and permendur.

Modification 3

In the magnetic deformable member 21 according to the present embodiment, the material of the magnetic portion 2 has been changed to a flexible magnetic film made of a hard material. Examples of the magnetic film include a paint film formed by applying an ink or a paint compounded with metal soft magnetic materials such as iron, nickel, and cobalt, soft magnetic alloys such as iron-silicon alloy, permalloy, sendust, and permendur, and magnetic powder such as soft ferrite. Examples of the binder contained in the ink or the paint include flexible resin materials such as a polyester resin, a vinyl resin, an epoxy resin, a polyurethane resin, an acrylic resin, and an olefin resin, besides the binder which can be used as the magnetic portion 2 described in relation to the first embodiment.

Figure 10A:
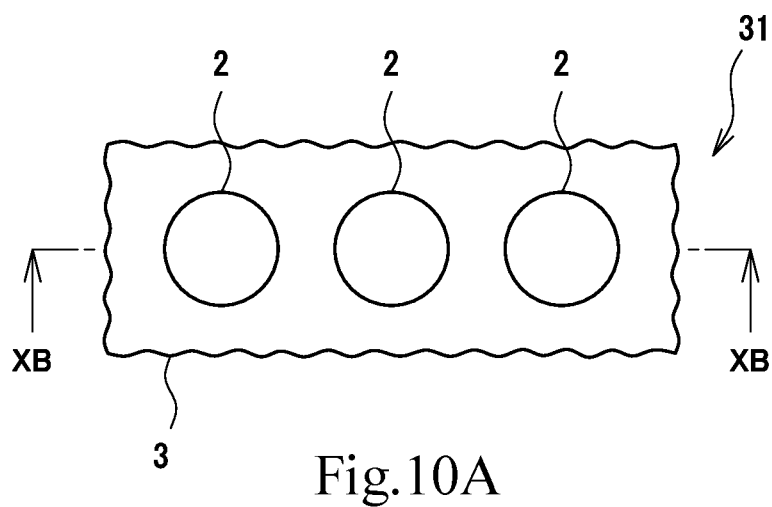
FIG. 10(A) is a plan view of the essential portion and FIG. 10(B) is a sectional view taken along the line 10(B)-10(B) of FIG. 10(A).
Figure 10B:
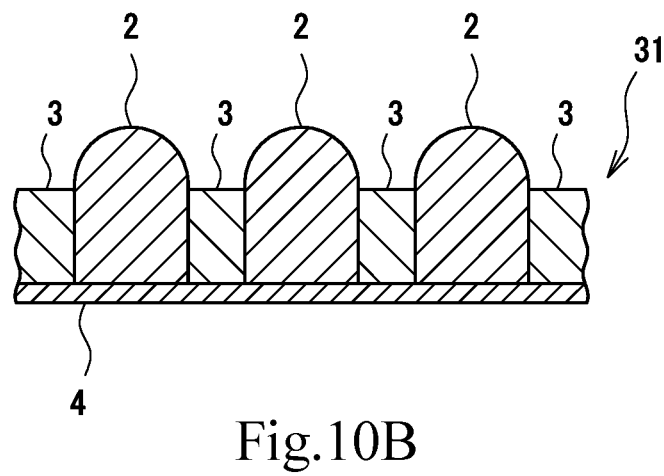
Figure 11:
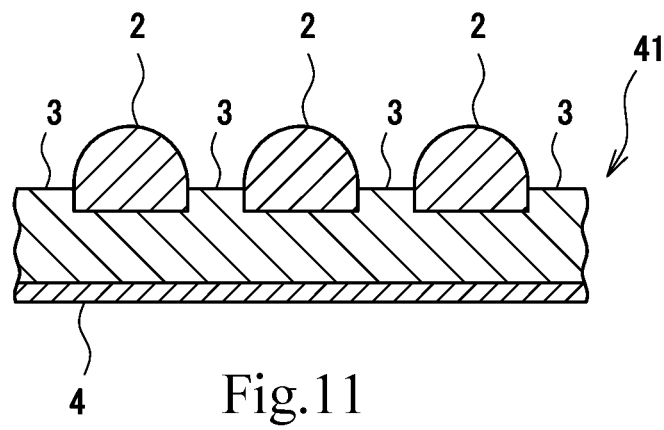
FIG. 11 illustrates an essential portion of a different magnetic deformable member according to the third embodiment, and is a sectional view corresponding to FIG. 10(B).
Figure 12A:
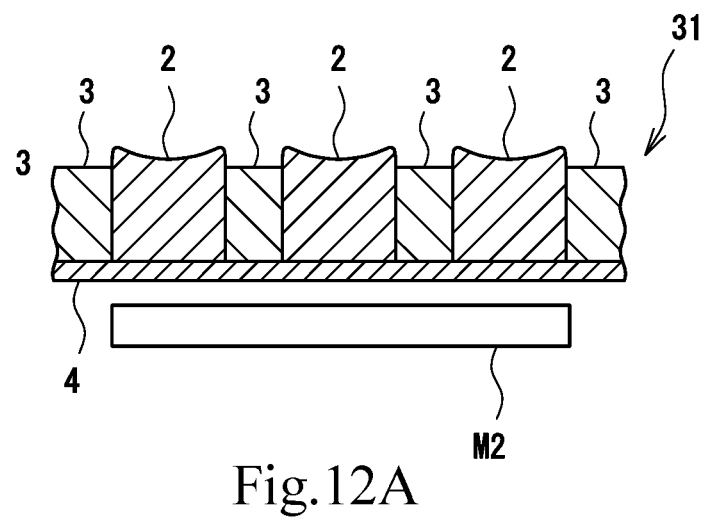
FIG. 12(A) is a sectional view of the magnetic deformable member illustrated in FIG. 10
Figure 12B:
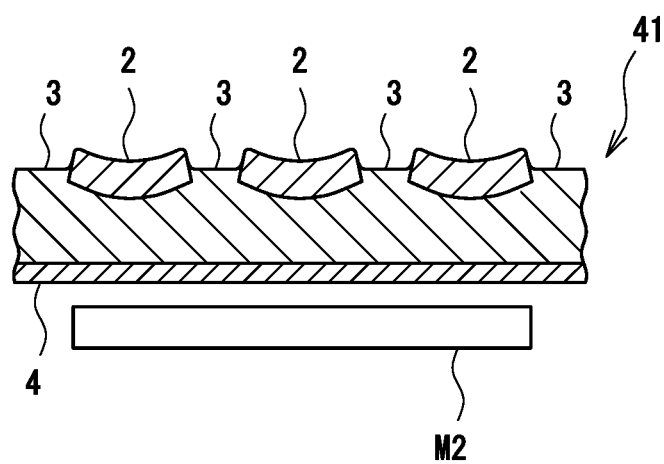
FIG. 12(B) is a sectional view of the magnetic deformable member illustrated in FIG. 11.

Third Embodiment [FIGS. 10 to 12]

FIG. 10 illustrates a magnetic deformable member 31 according to the present embodiment. In the magnetic deformable member 31, the magnetic portions 2 are configured to project from the front surface of the base portion 3. Also in a magnetic deformable member 41 illustrated in FIG. 11, the magnetic portions 2 are configured to project from the base portion 3. It should be noted, however, that the magnetic portions 2 of the magnetic deformable member 31 illustrated in FIG. 10 are configured to penetrate the base portion 3 in the thickness direction, while the magnetic portions 2 of the magnetic deformable member 41 illustrated in FIG. 11 are distributed unevenly on the side of the front surface of the base portion 3.

FIG. 12 schematically illustrates how the magnetic portions 2 are varied in the case where a magnetic field is applied. Also in the magnetic deformable members 31 and 41, when a magnetic field is applied, a center portion 2a of the magnetic portion 2 is displaced in the recessing direction by being attracted toward the magnet M2, and an end portion 2b of the magnetic portion 2 on the boundary with the base portion 3 is displaced to project outward, forming a magnetic deformable portion. Therefore, the magnetic portions 2 are deformed to be recessed and projected to a smaller degree. In other words, a front surface with high projections is varied into a nearly flat front surface. Consequently, variations in tactile feel can be felt.

The shape of the magnetic portion 2 which projects from the base portion 3 may be a hemispherical or dome shape in which the center of the magnetic portion 2 is projected with respect to the periphery thereof, as illustrated in FIGS. 10 and 11, besides a shape in which the magnetic portion 2 is projected uniformly from the base portion 3. When the magnetic portion 2 is in a hemispherical or dome shape in which the center of the magnetic portion 2 is projected to a slightly greater degree, the magnetic portion 2 can be deformed to be recessed and projected to a smaller degree, that is, displaced to be flat, when the magnetic portion 2 is subjected to compression deformation by applying a magnetic field, which allows variations in tactile feel to be felt easily.

Fourth Embodiment [FIG. 13]

Figure 13A:
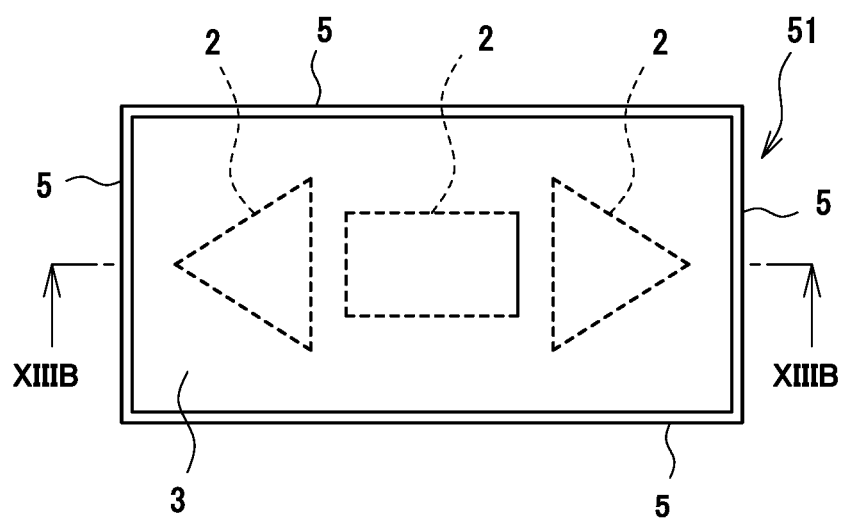
FIG. 13(A) is a plan view of the essential portion and FIG. 13(B) is a sectional view taken along the line 13(B)-13(B) of FIG. 13(A).
Figure 13B:
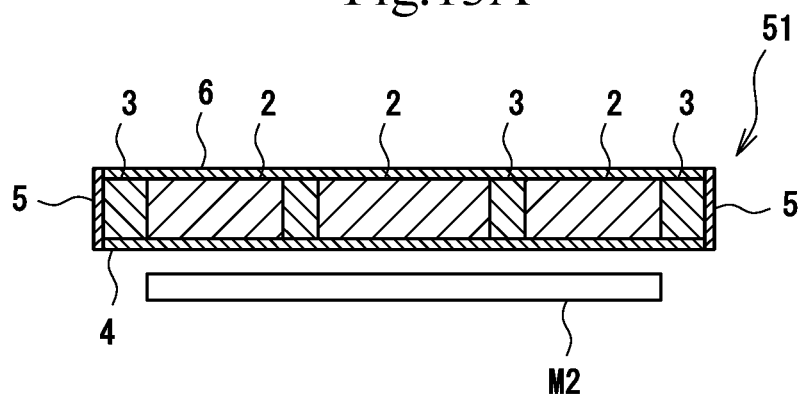

A magnetic deformable member 51 according to the present embodiment applies the magnetic deformable member 11, 21, 31, 41 described so far to be utilized as a display portion of an audio device or the like. FIG. 13 illustrates the configuration of an essential portion of the magnetic deformable member 51. FIG. 13(A) is a plan view of the magnetic deformable member 51, and FIG. 13(B) is a sectional view of the magnetic deformable member 51.

As illustrated in FIG. 13, three magnetic portions 2 provided to the magnetic deformable member 51 are formed into shapes corresponding to three operation buttons 7a, 7b, and 7c. In addition, a magnet M2 that may apply a magnetic field to all the operation buttons 7a, 7b, and 7c is provided.

In a state in which a magnetic field is not applied, the front surface is generally uniformly soft, and the operation buttons 7a, 7b, and 7c are not displayed. To cause the operation buttons 7a, 7b, and 7c to function as audio operation portions, a magnetic field is applied to float the three operation buttons 7a, 7b, and 7c from the front surface so that the positions of the operation buttons 7a, 7b, and 7c can be displayed.

In a modified form, three magnets M1 corresponding to the operation buttons 7a, 7b, and 7c may be provided so that the operation buttons 7a, 7b, and 7c can be individually floated from the surface to be displayed.

Fifth Embodiment [FIG. 14]

Figure 14A:
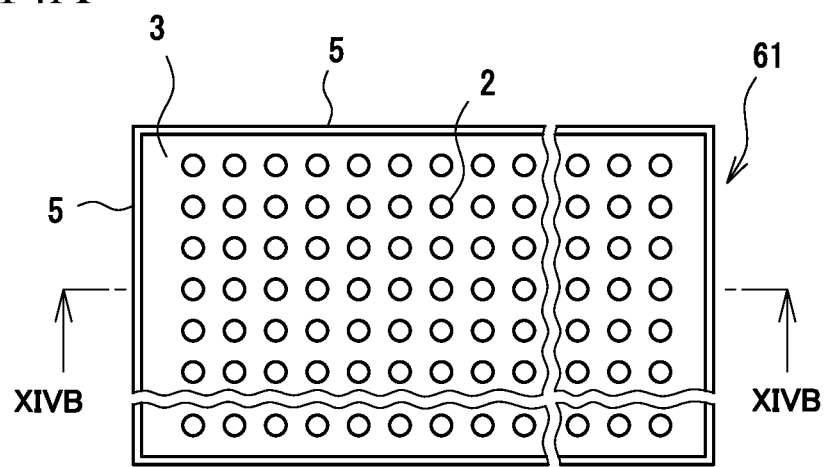
FIG. 14(A) is a plan view of the essential portion and FIG. 14(B) is a sectional view taken along the line 14(B)-14(B) of FIG. 14(A).
Figure 14B:
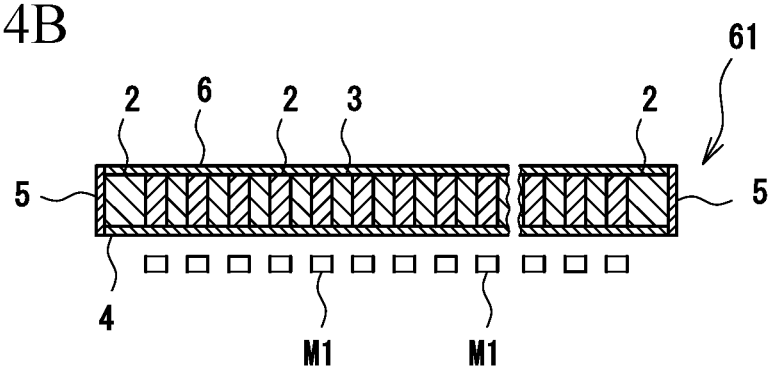

A magnetic deformable member 61 according to the present embodiment is utilized as a display device of a portable stereoscopic display screen. FIG. 14 illustrates the configuration of an essential portion of the magnetic deformable member 61. FIG. 14(A) is a plan view of the magnetic deformable member 61, and FIG. 14(B) is a sectional view of the magnetic deformable member 61. As illustrated in the drawings, each magnetic portion 2 has a circular column shape, and a plurality of magnetic portions 2 are regularly arranged vertically and horizontally in the base 3. The diameter of each magnetic portion 2 is selected from a range of 0.1 to 5 mm, and the length of the base portion 3 interposed between the magnetic portions 2 (clearance between the magnetic portions 2) is selected from a range of 0.1 to 10 mm.

A protecting portion 6 is provided on the display portion on the front surface, a hard portion 4 is provided on the back surface, and a regulating portion 5 is provided at the outer periphery of the base portion 3.

The diameter of the magnetic portion 2 is 0.1 to 5 mm, because variations in recess and projection of the front surface may be too small and variations in tactile feel may be too small when the diameter is less than 0.1 mm, and a tactile feel is varied through displacement of a single magnetic portion 2, rather than a tactile feel is varied by a plurality of magnetic portions 2, and only a smaller number of variation patterns can be handled when the diameter is more than 5 mm.

The clearance between the magnetic portions 2 is 0.1 to 10 mm, because displacement may be smaller with the magnetic portions 2 affecting each other when the clearance is less than 0.1 mm, and only a smaller number of variations patterns can be handled when the clearance is more than 10 mm.

Electromagnets (the magnets M1) corresponding to the individual magnetic portions 2 are disposed on the back surface s2 of the magnetic deformable member 61. A magnetic field can be applied to only one or more desired magnetic portions 2, among the plurality of magnetic portions 2 disposed vertically and horizontally, at the same time, while a magnetic field is not applied to the other magnetic portions 2.

With the magnetic portions 2 and the magnets M1 arranged as described above, only desired magnetic portions 2 can be displaced and hardened by applying a magnetic field to the magnetic portions 2. That is, by displaying a desired stereoscopic image by floating the magnetic portions 2 from the front surface of the display portion by displacing the desired magnetic portions 2, and varying the pattern of the applied magnetic field as the time elapses, the stereoscopic image can be varied to be enjoyed as a movie.

In a different specific example, predetermined magnetic portions 2 can be floated to form Braille characters to be utilized as a portable electronic Braille book.

Modifications

Instead of disposing the magnets in one-to-one correspondence with the magnetic portions 2, a plurality of magnets M1 that can each apply a magnetic field for a desired size exceeding the size of one magnetic portion 2 as a minimum unit may be provided. With such magnets, a magnetic field can be applied to magnetic portions 2 within the minimum region so that the magnetic portions 2 in the region to which a magnetic field is applied can be collectively displaced.

Although the magnetic portions 2 are arranged regularly in the examples described above, the magnetic portions 2 may not necessarily be arranged regularly. A desired stereoscopic image can also be obtained by controlling a magnetic field to be applied, even if the magnetic portions 2 are arranged at random or magnetic portions 2 with different shapes or clearances are used in combination.

Sixth Embodiment [FIG. 15]

Figure 15A:
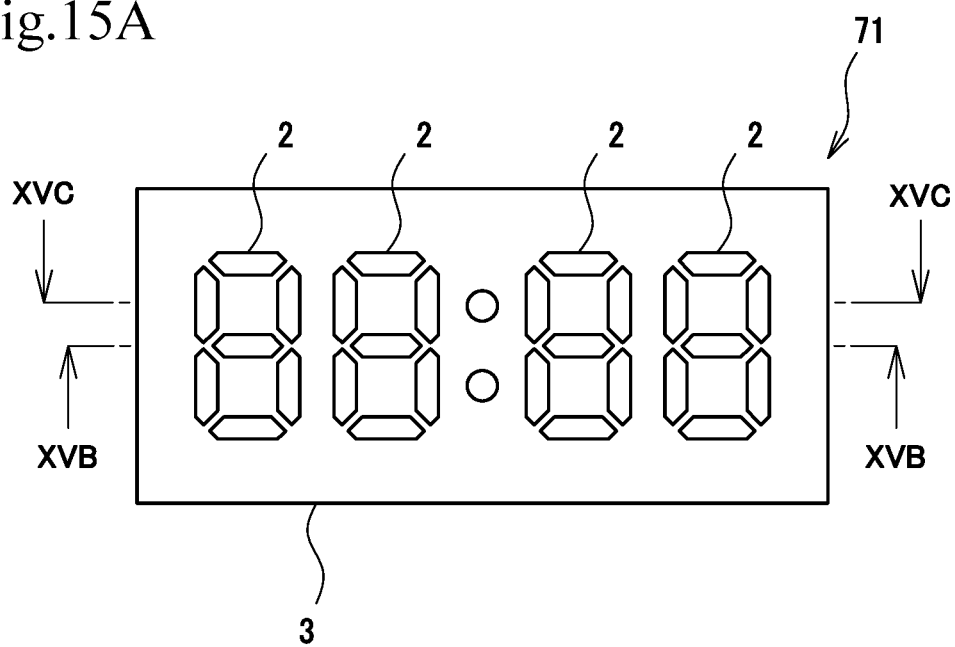
FIG. 15(A) is a plan view of the essential portion.
Figure 15B:
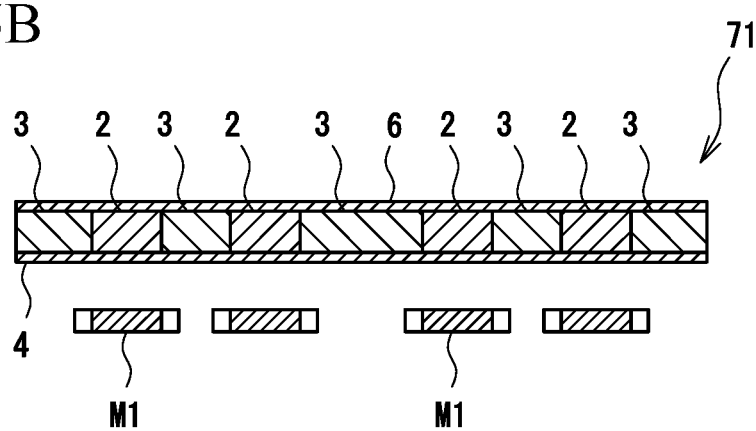
FIG. 15(B) is a sectional view taken along the line 15(B)-15(B) of FIG. 15(A)
Figure 15C:
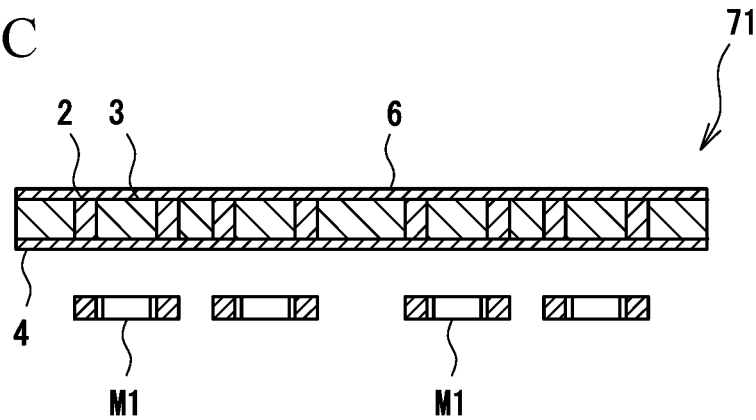
FIG. 15(C) is a sectional view taken along the line 15(C)-15(C) of FIG. 15(A).

A magnetic deformable member 71 according to the present embodiment is utilized as a time display device. FIG. 15 illustrates the configuration of an essential portion of the magnetic deformable member 71. FIG. 15(A) is a plan view of the magnetic deformable member 71, and FIGS. 15(B) and 15(C) are sectional views of the magnetic deformable member 71 taken at different positions in FIG. 15(A). As illustrated in the drawings, seven elements that may form each numeral 8 are each formed of one magnetic portion 2, and a magnet M1 that may apply a magnetic field is disposed for each magnetic portion 2.

When a magnetic field is not applied, no numeral is displayed. When a magnetic field is applied to predetermined magnetic portions 2, particular numerals can be floated to display the time.

EXAMPLES

Next, the present invention will be described with reference to examples.

Formation of Magnetic Deformable Members for Samples:

<Samples 1 to 7>

Magnetic deformable members 11, 21 corresponding to the first embodiment and the second embodiment were fabricated. First, magnetic deformable members 11 corresponding to the first embodiment were fabricated by forming a base portion 3 having the shape of a sheet 80 mm across and 50 mm down with a thickness of 2 mm and including three through holes 10 mm each side at the middle, and forming magnetic portions 2 so as to fill the through holes. Magnetic deformable members 11 for samples 1 to 7 were fabricated in this manner.

<Samples 8 to 15>

Meanwhile, magnetic deformable members 21 corresponding to the second embodiment were fabricated by printing three magnetic portions 2, 10 mm each side and with a predetermined thickness, at the middle on a mold release film by screen printing, inserting the mold release film into a mold, and molding a base portion 3 into the shape of a sheet 80 mm across and 50 mm down with a thickness of 2 mm. Magnetic deformable members 21 for samples 8 to 15 were fabricated in this manner. Samples 8 to 15 and samples 1 to 7 had the same shape as each other as viewed in plan.

<Sample 16>

Further, as a magnetic deformable member 11 according to the first embodiment, a magnetic deformable member 11 for sample 16 was fabricated, the magnetic deformable member 11 having a thickness of 2 mm and having a total of four magnetic portions 2, in two columns and two rows, penetrating the base portion 3 in the thickness direction and each in the shape of a dot with a diameter of 10 mm, the magnetic portions 2 being surrounded by the base portion 3.

<Sample 17>

Additionally, as a magnetic deformable member 21 according to the second embodiment, a magnetic deformable member 21 for sample 17 was fabricated, the magnetic deformable member 21 having a thickness of 2 mm and having a total of four magnetic portions 2, in two columns and two rows, having a thickness of 0.15 mm and each in the shape of a dot with a diameter of 10 mm, the magnetic portions 2 being surrounded by the base portion 3. Sample 16 and sample 17 had the same shape as each other as viewed in plan.

<Sample 18>

As a sample corresponding to a comparative example, the entire sheet 80 mm across and 50 mm down and with a thickness of 2 mm was formed of a material corresponding to the magnetic portions 2. A magnetic deformable member for sample 18 was fabricated in this manner.

Specific materials forming each sample, properties, amount added, etc. are indicated in detail in Table 1 for the magnetic deformable members for samples 1 to 18. The base portion 3 of each sample was formed with an addition-reaction silicone. The magnetic portion 2 was formed by hardening a mixed composition obtained by compounding the addition-reaction silicone, which was the same as the base portion 3, with silicon iron powder (magnetic powder) in a spherical shape with an average particle diameter of 5 μm as magnetic bodies. The amount of magnetic powder compounded in each sample is indicated in Table 1.

TABLE 1

| | SHAPE | SAMPLE 1 | SAMPLE 2 | SAMPLE 3 | SAMPLE 4 | SAMPLE 5 | SAMPLE 6 | SAMPLE 7 | SAMPLE 8 | SAMPLE 9 | SAMPLE 10 |
|---|---|---|---|---|---|---|---|---|---|---|---|
| | | | | THROUGH HOLE TYPE | | | | | RECESSED GROOVE TYPE | | |
| CONSTITUTION | THICKNESS OF SAMPLE (mm) | 2 | 2 | 2 | 2 | 2 | 2 | 2 | 2 | 2 | 2 |
| | THICKNESS OF MAGNETIC PORTION (mm) | 2 | 2 | 2 | 2 | 2 | 2 | 2 | 0.15 | 0.15 | 0.15 |
| | AMOUNT OF MAGNETIC POWDER COMPOUNDED (vol %) | 40 | 40 | 40 | 40 | 20 | 6 | 49 | 40 | 40 | 40 |
| HARDNESS | E HARDNESS OF MAGNETIC PORTION | 47 | 2 | 2 | 2 | 0 | 0 | 15 | 0 | 2 | 2 |
| | E HARDNESS OF BASE PORTION | 0 | 5 | 1 | 0 | 0 | 0 | 0 | 0 | 1 | 0 |
| | PENETRATION NUMBER OF MAGNETIC PORTION | 30 | 110 | 110 | 110 | 190 | 300 | 80 | 30 | 110 | 110 |
| | PENETRATION NUMBER OF BASE PORTION | 320 | 80 | 120 | 320 | 320 | 320 | 320 | 320 | 120 | 320 |
| | HARDNESS OF MAGNETIC PORTION (N) | 29.8 | 4.2 | 4.2 | 4.2 | 3.5 | 2.5 | 4.3 | 4.0 | 7.1 | 4.1 |
| | HARDNESS OF BASE PORTION (N) | 3.8 | 15.2 | 7.1 | 3.8 | 3.8 | 3.8 | 3.8 | 3.8 | 7.1 | 3.8 |
| | HARDNESS OF MAGNETIC PORTION WITH APPLICATION OF MAGNETIC FIELD (N) | 33.7 | 9.6 | 9.6 | 9.6 | 7.2 | 4.3 | 15.6 | 4.3 | 7.2 | 4.3 |
| | VARIATIONS IN HARDNESS OF MAGNETIC PORTION WITH APPLICATION OF MAGNETIC FIELD (%) | 113 | 228 | 228 | 228 | 204 | 171 | 364 | 108 | 101 | 106 |
| | EVALUATION OF VARIATIONS IN HARDNESS | Δ | ⊙ | ⊙ | ⊙ | ⊙ | ○ | ⊙ | X | X | X |
| DISPLACEMENT | DISPLACEMENT AT CENTER PORTION (μm) | −20 | −4 | −70 | −82 | −98 | −31 | −118 | −237 | −4 | −176 |
| | DISPLACEMENT AT BOUNDARY PORTION (μm) | 48 | 13 | 129 | 107 | 56 | 43 | 63 | 28 | 16 | 120 |
| | MAGNITUDE OF DISPLACEMENT (μm) | 68 | 17 | 199 | 189 | 154 | 73 | 181 | 265 | 20 | 295 |
| | EVALUATION OF MAGNITUDE OF DISPLACEMENT | ○ | Δ | ○ | ○ | ○ | ○ | Δ | ⊙ | Δ | ⊙ |
| | VARIATIONS IN TACTILE FEEL | Δ | ⊙ | ⊙ | ⊙ | ⊙ | ○ | ○ | ○ | Δ | ○ |

| | | SAMPLE 11 | SAMPLE 12 | SAMPLE 13 | SAMPLE 14 | SAMPLE 15 | SAMPLE 16 | SAMPLE 17 | SAMPLE 18 |
|---|---|---|---|---|---|---|---|---|---|
| | SHAPE | | | RECESSED GROOVE TYPE | | | THROUGH HOLE TYPE | RECESSED GROOVE TYPE | CONVENTIONAL TYPE |
| CONSTITUTION | THICKNESS OF SAMPLE (mm) | 2 | 2 | 2 | 2 | 2 | 2 | 2 | 2 |

TABLE 1-continued

| | | | | | | | | | |
|---|---|---|---|---|---|---|---|---|---|
| TUTION | THICKNESS OF MAGNETIC PORTION (mm) | 0.15 | 0.15 | 0.15 | 0.50 | 1.0 | 2.0 | 0.15 | 2 |
| | AMOUNT OF MAGNETIC POWDER COMPOUNDED (vol %) | 21 | 6 | 49 | 40 | 40 | 40 | 40 | 40 |
| HARDNESS | E HARDNESS OF MAGNETIC PORTION | 0 | 0 | 15 | 2 | 2 | 2 | 2 | 2 |
| | E HARDNESS OF BASE PORTION | 0 | 0 | 0 | 0 | 0 | 0 | 0 | — |
| | PENETRATION NUMBER OF MAGNETIC PORTION | 190 | 300 | 80 | 110 | 110 | 110 | 110 | 110 |
| | PENETRATION NUMBER OF BASE PORTION | 320 | 320 | 320 | 320 | 320 | 320 | 320 | — |
| | HARDNESS OF MAGNETIC PORTION (N) | 3.9 | 3.8 | 4.0 | 4.2 | 4.6 | 4.0 | 3.9 | 4.2 |
| | HARDNESS OF BASE PORTION (N) | 3.8 | 3.8 | 3.8 | 3.8 | 3.8 | 3.8 | 3.8 | — |
| | HARDNESS OF MAGNETIC PORTION WITH APPLICATION OF MAGNETIC FIELD (N) | 4.1 | 3.9 | 4.2 | 4.6 | 10.2 | 6.6 | 3.9 | 9.6 |
| | VARIATIONS IN HARDNESS OF MAGNETIC PORTION WITH APPLICATION OF MAGNETIC FIELD (%) | 105 | 100 | 106 | 111 | 224 | 165 | 100 | 228 |
| | EVALUATION OF VARIATIONS IN HARDNESS | X | X | X | Δ | ⊙ | ○ | X | ⊙ |
| DISPLACEMENT | DISPLACEMENT AT CENTER PORTION (μm) | −162 | −22 | −236 | −580 | −202 | −231 | −157 | −28 |
| | DISPLACEMENT AT BOUNDARY PORTION (μm) | 119 | 21 | 86 | 128 | 110 | 73 | 35 | −12 |
| | MAGNITUDE OF DISPLACEMENT (μm) | 281 | 43 | 323 | 708 | 313 | 304 | 193 | 16 |
| | EVALUATION OF MAGNITUDE OF DISPLACEMENT | ⊙ | Δ | ⊙ | ⊙ | ○ | ⊙ | ○ | X |
| | VARIATIONS IN TACTILE FEEL | ○ | Δ | ○ | ○ | ⊙ | ⊙ | Δ | X |

Properties of Samples:

<Measurement of Hardness>

Test pieces with a thickness of 10 mm and made of materials used for the magnetic portions 2 and the base portion 3 of each sample were prepared, and the E hardness of the test pieces was measured using a hardness meter of the type E according to JIS K 6253. The measurement results are indicated in Table 1.

<Measurement of Amount of Displacement of Magnetic Portion>

Each sample was placed on a polycarbonate resin plate with a thickness of 1 mm, a neodymium magnet (0.18 Tesla) in a circular column shape with a diameter of 30 mm and a height of 5 mm was disposed below the resin plate to apply a magnetic field, and displacement of the front surfaces of the magnetic portions 2 before and after application of a magnetic field was measured using a CNC image measuring machine ("QV202-PRO" manufactured by Mitutoyo Corporation). In the measurement results, displacement in the direction of projecting from the front surface is indicated by "+", and displacement in the direction of sinking from the front surface is indicated by "−". Displacement in sample 18 was measured at generally the same position as the measurement position for the other samples along the outer shape of the magnet M1. The measurement results are indicated in Table 1. In Table 1, displacement at the center portion 2a of the magnetic portion 2 is indicated in the item "displacement at center portion", displacement at a boundary-side end portion 2b of the magnetic portion 2 on the boundary with the base portion 3 is indicated in the item "displacement at boundary portion", and the difference between such displacements is indicated in the item "magnitude of displacement".

<Measurement of Penetration Number>

Test pieces with a thickness of 10 mm and made of materials that form the magnetic portions 2 and the base portion 3 of each sample were prepared separately from the sample, and the penetration number of the front surface was measured using a device that conforms to JIS K 2220. In that event, a needle in the shape prescribed in JIS K 2207 was used, and the total weight of the needle and a needle fixing device (i.e. the weight on the test piece) was 50 g. The measurement results are indicated in Table 1.

<Measurement of Hardness>

A load applied when each test piece was compressed to 50% at a compression speed of 1 mm/min was measured using a probe made of metal in a circular column shape having a flat surface at the distal end with a diameter of 5 mm. The measurement results are indicated in the items "hardness (N) of magnetic portion 2" and "hardness (N) of base portion 3" in Table 1. The load was also measured in a similar manner for the magnetic portion 2 with a magnetic field of 0.18 Tesla applied. The measurement results are indicated in the item "hardness (N) of magnetic portion 2 with application of magnetic field" in Table 1. Further, the ratio of the hardness of the magnetic portion 2 with application of a magnetic field to the hardness of the magnetic portion 2 without application of a magnetic field (hardness (N) of magnetic portion 2 with application of magnetic field/hardness (N) of magnetic portion 2 without application of magnetic field×100) is indicated in the item "variations (%) in hardness of magnetic portion 2 with application of magnetic field" in Table 1.

Evaluation of Samples:

<Evaluation of Magnitude of Displacement>

Those samples which exhibited minus displacement at the center portion 2a and plus displacement at the boundary portion and which had a displacement magnitude value of 200 μm or more were evaluated as "⊙".

Those samples which exhibited minus displacement at the center portion 2a and plus displacement at the boundary portion and which had a displacement magnitude value of 50 μm or more and less than 200 μm were evaluated as "0".

Those samples which exhibited minus displacement at the center portion 2a and plus displacement at the boundary portion and which had a displacement magnitude value of 10 μm or more and less than 50 μm were evaluated as "Δ".

Those samples which exhibited displacement in the same direction at both the center portion 2a and the boundary portion and those samples which exhibited minus displacement at the center portion 2a and plus displacement at the boundary portion and which had a displacement magnitude value of less than 10 μm were evaluated as "x". The evaluation results are indicated in Table 1.

<Evaluation of Variations in Hardness>

Variations in hardness of the test pieces corresponding to the samples were evaluated as follows. Those samples with variations between the hardness with application of a magnetic field and the hardness without application of a magnetic field being less than 110% were evaluated as "x". Those samples with such variations being 110% or more and less than 150% were evaluated as "Δ". Those samples with such variations being 150% or more and less than 200% were evaluated as "○". Those samples with such variations being 200% or more were evaluated as "⊙". The evaluation results are indicated in Table 1.

<Evaluation of Variations in Tactile Feel>

The samples were evaluated as follows on the basis of the evaluation results for the magnitude of displacement and the evaluation results for the variations in hardness. Those samples with "⊙ and ⊙" and "⊙ and ○" were evaluated as "⊙". Those samples with "○ and ○", "⊙ and Δ", "○ and Δ", and "x and ⊙" were evaluated as "○". Those samples with "Δ and Δ", "x and ○", and "x and Δ" were evaluated as "Δ". Those samples with "x" for the displacement were evaluated as "x", irrespective of the evaluation of the hardness. The evaluation results are indicated in the item "variations in tactile feel" in Table 1. The notations such as "○ and ○" given above indicate the evaluation results for the magnitude of displacement with the former symbol, and the evaluation results for the hardness with the latter symbol.

Consideration

<Comparison with Related Art>

Sample 18 is a sample entirely formed of the material of the magnetic portion 2 with no base portion 3 formed. When a magnetic field was applied to sample 18, the sample exhibited no displacement in the direction of projecting from the front surface, and was displaced such that the front surface which had been flat was gently recessed, and therefore substantially no variations in tactile feel were felt. In samples 1 to 17, in contrast to sample 18, the boundary of the magnetic portion 2 with the base portion 3 was displaced in the projecting direction, and the center portion of the magnetic portion 2 was displaced in the recessing direction, and remarkable variations in tactile feel were felt.

<Effect of Hardness of Magnetic Portion>

Samples 1 and 4 to 7, the magnetic portions 2 of which have different hardnesses, are compared. Sample 1, which had a slightly hard magnetic portion 2 with a penetration number of 30, was evaluated as "Δ" for variations in hardness. This is considered to be because the sample had a certain degree of hardness also before application of a magnetic field and therefore exhibited small variations in hardness. On the other hand, sample 6, which had a flexible magnetic portion 2 with a penetration number of 300, was evaluated as "○" for variations in hardness. This is considered to be because sample 6 contained a reduced amount of magnetic powder compounded in order to make the magnetic portion 2 significantly flexible and therefore the binding force among particles of the magnetic powder caused by a predetermined magnetic force was so weak that the hardness of the magnetic portion 2 was not increased significantly when a magnetic field was applied. In contrast to such samples, samples 4, 5, and 7 exhibited significant variations in hardness, of 200% or more. Sample 7 with a penetration number of 80 exhibited variations in hardness of more than 300%. It is seen from these results that the samples exhibit a preferable increase in variations in hardness when the hardness of the magnetic portion 2 corresponds to a penetration number of 80 to 190.

Sample 1, which had a slightly hard magnetic portion 2 with a penetration number of 30, was evaluated as "○" with a magnitude of displacement of 68 μm. On the other hand, sample 6, which had a flexible magnetic portion 2 with a penetration number of 300, was also evaluated as "○" with a magnitude of displacement of 73 μm. In addition, sample 4 with a penetration number of 110 and sample 5 with a penetration number of 190 were also evaluated as "○" for the magnitude of displacement. It is seen from these results that the samples exhibit a preferable increase in magnitude of displacement when the hardness of the magnetic portion 2 corresponds to a penetration number of 30 to 300, and that the samples exhibit a more preferable increase in magnitude of displacement when the hardness of the magnetic portion 2 corresponds to a penetration number of 110 to 190.

The magnitude of displacement for sample 1 was about 68 μm, because it is considered that significant displacement was not caused by a stress caused by a predetermined magnetic force, since the magnetic portion 2 was so hard. The magnitude of displacement for sample 6 was about 73 μm, because it is considered that significant displacement was still not caused by a small stress caused by a predetermined magnetic force, although the amount of magnetic powder compounded was reduced and the magnetic portion 2 was significantly flexible.

In contrast to samples 1 and 4 to 7 in which the magnetic portions 2 penetrated the base portion 3, samples 8 and 10 to 13 in which the magnetic portions 2 were provided on the base portion 3 were all evaluated as "x" for "variations in hardness". This is considered to be because the entire stacked body was not hardened because of the softness of the base portion 3, irrespective of whether or not a magnetic field was applied, since the base portion 3 on which the magnetic portion 2 was stacked was flexible although the hardness of the magnetic portion 2 itself was varied. Thus, it is seen that, with the configuration in which the magnetic portion 2 is stacked on the base portion 3 as in such samples, a magnetic deformable member 21, the hardness of which is not easily variable by application of a magnetic field, can be obtained.

Sample 8, which had a slightly hard magnetic portion 2 with a penetration number of 30, was evaluated as "⊙" with a magnitude of displacement of 265 μm. This result is contrastive with the result with sample 1. This is considered to be because the magnetic portion 2 which was hard was stacked on the base portion 3 which was flexible and therefore deformation was permitted even if the magnetic portion 2 was slightly hard. More specifically, sample 1 was displaced with the magnetic portion 2 compressed and expanded, while sample 8 was displaced with the magnetic portion 2 bent, rather than being compressed or expanded. Therefore, it is considered that significant displacement was obtained, if bending was permitted, even in the case where the magnetic portion 2 was so hard as not to be easily expandable.

On the other hand, sample 12, which had a flexible magnetic portion 2 with a penetration number of 300, was evaluated as "Δ" for the magnitude of displacement. In sample 12, the magnetic portion 2 was significantly flexible with a reduced amount of magnetic powder compounded. In this case, however, it is considered that a stress that caused significant displacement was not caused since a small stress was caused by a predetermined magnetic force and a film thickness was also small. For samples 10 and 11, as for samples 4 and 5, the magnitude of displacement was large. It is seen from these results that, in the case of a configuration in which a magnetic portion 2 with a predetermined thickness is formed and the magnetic portion 2 and a base portion 3 are stacked on each other, the samples exhibit a preferable increase in magnitude of displacement when the hardness of the magnetic portion 2 corresponds to a penetration number of 30 to 190.

<Effect of Hardness of Base Portion>

The evaluation results for "variations in hardness" were the same for samples 2 to 4, the base portions 3 of which had different hardnesses, and the evaluation results for "variations in hardness" were not affected by the hardness of the base. On the other hand, the evaluation results for "magnitude of displacement" was "Δ" with a small magnitude of displacement for sample 2, the base portion 3 of which had a penetration number of 80, and "○" for samples 3 and 4. Thus, it is considered that, in sample 2, deformation was suppressed with the base portion 3 being hard and with the magnetic portion 2 bound on the boundary between the magnetic portion 2 and the base portion 3. On the other hand, significant displacement was caused in samples 3 and 4, the base portion 3 of which had a penetration number of 120 and 320, respectively. It is considered that significant displacement can be caused when the base portion 3 has a penetration number of 120 or more, and that the magnitude of displacement of the magnetic portion 2 can be made larger as the base portion 3 is more flexible.

The "evaluation of variations in hardness" was "x" for both samples 9 and 10, as when the hardness of the magnetic portion 2 was varied. The reason is also similar, and it is considered to be because the hardness of the base portion 3 on which the magnetic portion 2 was stacked was predominant although the hardness of the magnetic portion 2 itself was varied and the hardness of the entire stacked body was not easily varied irrespective of whether or not a magnetic field was applied. It should be noted, however, that as the hardness of the base portion 3 became higher, the effect of the hardness of the base portion 3 became smaller and the hardness was varied to a slightly larger degree.

Meanwhile, the "evaluation of magnitude of displacement" was "Δ" for sample 9, the base portion 3 of which had a penetration number of 120, and "☉" for sample 10, the base portion 3 of which had a penetration number of 320, and it is considered that the magnitude of displacement becomes larger as the penetration number of the base portion 3 is larger.

<Effect of Amount of Magnetic Powder Compounded>

When samples 4 to 7, in which the amount of magnetic powder compounded is different for the same matrix, are compared for "evaluation of variations in hardness", it is seen that the hardness is varied more significantly as the amount of magnetic powder compounded becomes larger. Sample 6 with a small amount of magnetic powder compounded was evaluated as "○" for variations in hardness, while the other samples were evaluates as "☉" for variations in hardness. Thus, it is seen that the samples exhibit a preferable increase in variations in hardness when the amount of magnetic powder compounded is 20 to 49 mass %.

The "magnitude of displacement" was small for both sample 6 with a small amount of magnetic powder added and sample 7 with a large amount of magnetic powder added. With sample 6 with a small amount of magnetic powder compounded, it is considered that significant displacement was not caused by a small stress caused by a predetermined magnetic force. With sample 7 with a large amount of magnetic powder compounded, on the other hand, it is considered that particles of the magnetic powder had contacted each other since before a magnetic field was applied, and that significant displacement was not caused since the clearance between the particles of the magnetic powder was not easily variable even if the particles were attracted each other using a magnetic force. It is seen from these results that the samples exhibit a preferable increase in magnitude of displacement when the amount of magnetic powder compounded is 20 to 40 mass %.

The "evaluation of variations in hardness" was "x" for all of samples 10 to 13, as when the hardness of the magnetic portion 2 was varied. The reason is also similar, and it is considered to be because the hardness of the base portion 3 on which the magnetic portion 2 was stacked was predominant although the hardness of the magnetic portion 2 itself was varied and the hardness of the entire stacked body was not easily varied irrespective of whether or not a magnetic field was applied.

The magnitude of displacement was small for sample 12 with the amount of magnetic powder added being 6 mass %, while the magnitude of displacement was large for samples 10, 11, and 13 with the amount of magnetic powder added being 20 to 45 mass %. It is seen from these results that, in the case of a configuration in which a magnetic portion 2 with a predetermined thickness is formed and the magnetic portion 2 is stacked on a base portion 3, the samples can exhibit a large magnitude of displacement when the amount of magnetic powder added is 20 mass % or more.

<Thickness of Magnetic Portion>

For samples 4, 10, 14, and 15, in which the thickness of the magnetic portion 2 was varied while the total thickness was constant at 2 mm, the "evaluation of variations in hardness" was "☉" for sample 4, "○" for sample 15, "Δ" for sample 14, and "x" for sample 10. In this test, in which samples were compressed to 50%, it is seen that variations in hardness of the magnetic portion 2 were predominant and the hardness was varied significantly with sample 15, 50% of the total thickness of which was occupied by the magnetic portion 2. On the other hand, it is seen that the base portion 3 which was stacked on the magnetic portion 2 was predominant and the hardness was varied slightly for sample 14, 25% of the total thickness of which was occupied by the magnetic portion 2. It is seen from these results that the hardness is varied more significantly as the magnetic portion 2 is thicker.

For "magnitude of displacement", on the other hand, all of the samples exhibited a large amount of displacement, and it is seen that large displacement can be obtained irrespective of the thickness of the magnetic portion 2.

Regarding "variations in hardness" for samples 16 and 17, sample 16 was evaluated as "○", and sample 17 was evaluated as "x". The magnetic portion 2 in sample 16 penetrates the base portion 3 in the thickness direction, but is surrounded by the base portion 3 which is flexible. Therefore, it is considered that variations in hardness were slightly small as a whole with ascent of a load mitigated with the magnetic portion 2 bulging sideways when pressed. For sample 17, on the other hand, it is considered to be because the hardness of the base portion 3 on which the magnetic portion 2 was stacked was predominant although the hardness of the magnetic portion 2 itself was varied and the hardness of the entire stacked body was not easily varied irrespective of whether or not a magnetic field was applied.

Regarding "magnitude of displacement", on the other hand, the boundary portion 3 was observed to project in both samples 16 and 17. It was also observed that, among a plurality of magnetic portions 2, only a magnetic portion 2 to which a magnetic field was applied was displaced.

The above embodiments and examples are illustrative of the present invention. The embodiments may be modified, the related art may be added thereto, and the embodiments may be combined with each other without departing from the scope and spirit of the present invention. The resulting technologies also fall within the scope of the present invention. For example, the shapes of the magnetic portion 2, the base portion 3, and the magnetic deformable member 11, 21, 31, 41, 51, 61, 71 illustrated in the drawings are exemplary, and the present invention is not limited thereto.

REFERENCE SIGNS LIST 11, 21, 31, 41, 51, 61, 71 MAGNETIC DEFORMABLE MEMBER
2 MAGNETIC PORTION
2a CENTER PORTION
2b END PORTION ON BOUNDARY WITH BASE PORTION
3 BASE PORTION
3b END PORTION ON BOUNDARY WITH MAGNETIC PORTION
4 HARD PORTION
5 REGULATING PORTION
6 PROTECTING PORTION
7a, 7b, 7c OPERATION BUTTON
8 NUMERAL
s1 FRONT SURFACE
s2 BACK SURFACE (SURFACE OPPOSITE TO FRONT SURFACE)
M1, M2 MAGNET

The invention claimed is:

1. A magnetic deformable member comprising:
a magnetic portion formed of a magnetic elastic body; and
a base portion formed of a non-magnetic elastic body that covers at least a side surface of the magnetic portion,
wherein at least the magnetic portion has a magnetic deformable portion in which shape deformation is caused by application of a magnetic field, the magnetic deformable portion being provided at a boundary-side end portion on a boundary with the base portion, and a display portion in which the shape deformation is displayed is provided on a front surface of the magnetic deformable member.

2. The magnetic deformable member according to claim 1,
wherein the shape deformation is caused in the magnetic deformable portion such that the boundary-side end portion projects relatively outward with respect to a center portion of the magnetic portion.

3. The magnetic deformable member according to claim 1,
wherein the base portion has a base deformable portion in which shape deformation is caused along with the shape deformation of the magnetic deformable portion of the magnetic portion, the base deformable portion being provided at a boundary-side end portion on a boundary with the magnetic portion.

4. The magnetic deformable member according to claim 1, further comprising:
a rigid hard portion provided on respective surfaces of the base portion and the magnetic portion that are opposite to the front surface.

5. The magnetic deformable member according to claim 1, further comprising:
a protecting portion provided on the front surface to protect respective surfaces of the magnetic portion and the base portion.

6. The magnetic deformable member according to claim 1, further comprising:
a regulating portion provided at an outer edge of the base portion, the regulating portion being harder than the base portion.

7. The magnetic deformable member according to claim 1, further comprising:
a magnet provided opposite to the front surface to apply the magnetic field.

8. The magnetic deformable member according to claim 1,
wherein a magnet is disposed to form the magnetic field by applying a magnetic force line in a direction intersecting the front surface.

9. The magnetic deformable member according to claim 1,
wherein the display portion is an operation portion on which a touch operation or a pressing operation for an electronic device is performed.

10. The magnetic deformable member according to claim 1,
wherein the magnetic deformable portion is shaped to display a Braille character, a character, a numeral, a symbol, or a pattern.

11. The magnetic deformable member according to claim 1,
wherein a plurality of magnetic portions are provided, and the plurality of magnetic portions are disposed such that respective magnetic deformable portions of the magnetic portions are integrated with each other to form predetermined display.

12. The magnetic deformable member according to claim 1,
wherein the magnetic portion is shaped to penetrate the base portion in a thickness direction.

13. The magnetic deformable member according to claim 1,
wherein the base portion covers a portion of the magnetic portion other than the front surface.

14. The magnetic deformable member according to claim 1,
wherein the magnetic portion is formed to project from the base portion.

15. The magnetic deformable member according to claim 1, wherein the magnetic portion is formed of a gel.

16. The magnetic deformable member according to claim 1, wherein the magnetic portion has a viscous fluid in which magnetic bodies are dispersed and a flexible film that covers the viscous fluid.

17. The magnetic deformable member according to claim 1, wherein the magnetic portion is formed of a thin film made of a magnetic metal foil or a flexible magnetic film.

18. The magnetic deformable member according to claim 1, the magnetic portion has an E hardness, prescribed by JIS, of 0 to 50.

* * * * *